US012562557B2

(12) United States Patent
Tatsumi et al.

(10) Patent No.: US 12,562,557 B2
(45) Date of Patent: Feb. 24, 2026

(54) METHOD FOR MANUFACTURING BUSBAR ASSEMBLY

(71) Applicant: Suncall Corporation, Kyoto (JP)

(72) Inventors: Shota Tatsumi, Kyoto (JP); Yuusuke Adachi, Kyoto (JP)

(73) Assignee: Suncall Corporation, Kyoto (JP)

( * ) Notice: Subject to any disclaimer, the term of this patent is extended or adjusted under 35 U.S.C. 154(b) by 267 days.

(21) Appl. No.: 18/031,324

(22) PCT Filed: Sep. 24, 2021

(86) PCT No.: PCT/JP2021/035020
§ 371 (c)(1),
(2) Date: Apr. 11, 2023

(87) PCT Pub. No.: WO2022/080115
PCT Pub. Date: Apr. 21, 2022

(65) Prior Publication Data
US 2023/0378736 A1 Nov. 23, 2023

(30) Foreign Application Priority Data
Oct. 12, 2020 (JP) ................................. 2020-171749

(51) Int. Cl.
*H02G 5/00* (2006.01)
*H01L 21/48* (2006.01)
(Continued)

(52) U.S. Cl.
CPC ........... *H02G 5/005* (2013.01); *H01L 21/481* (2013.01); *H01L 21/4871* (2013.01);
(Continued)

(58) Field of Classification Search
CPC ...... H02G 5/005; H02G 5/007; H01L 21/481; H01L 21/4871; H01L 23/49894; H01L 25/0753; H10H 20/0362; H10H 20/852
See application file for complete search history.

(56) References Cited

U.S. PATENT DOCUMENTS

2018/0151782 A1 * 5/2018 Shirahama ........... H10H 20/852
2018/0175255 A1 * 6/2018 Morikawa ........... H01L 25/0753

FOREIGN PATENT DOCUMENTS

JP 2010-021374 A 1/2010
JP 4432913 B2 3/2010
(Continued)

OTHER PUBLICATIONS

Dyck et al, "Influence of the Bead Geometry and the Tin Layer on the Contact Resistance of Copper Conductors," in IEEE Transactions on Components, Packaging and Manufacturing Technology, vol. 8, No. 10, pp. 1863-1868, Oct. 2018. (Year: 2018).*
(Continued)

*Primary Examiner* — A. Dexter Tugbang
(74) *Attorney, Agent, or Firm* — Sterne, Kessler, Goldstein & Fox P.L.L.C.

(57) ABSTRACT

According to a manufacturing method of the present invention, it is possible to manufacture a busbar assembly in an efficient manner, the busbar assembly including busbars disposed in parallel in a common plane and an insulative resin layer including a gap filling portion filled into a gap between the adjacent busbars and a bottom-surface-side laminated portion extending integrally from the gap filling portion and arranged on bottom surfaces of the busbars, a top surface of the busbar being at least partially exposed to form a top-surface-side connection portion, the bottom surface of the busbar including a first bottom surface region which is located at the same position in a thickness direction as a lower end portion of the gap and on which the (Continued)

bottom-surface-side laminated portion is arranged and a second bottom surface region located farther away from the top surface than the first bottom surface region and exposed to the outside to form a bottom-surface-side connection portion.

7 Claims, 17 Drawing Sheets

(51) Int. Cl.

| | | |
|---|---|---|
| *H01L 23/498* | (2006.01) | |
| *H01L 25/075* | (2006.01) | |
| *H10H 20/01* | (2025.01) | |
| *H10H 20/852* | (2025.01) | |

(52) U.S. Cl.
CPC ....... *H02G 5/007* (2013.01); *H01L 23/49894* (2013.01); *H01L 25/0753* (2013.01); *H10H 20/0362* (2025.01); *H10H 20/852* (2025.01)

(56) References Cited

FOREIGN PATENT DOCUMENTS

| | | | | |
|---|---|---|---|---|
| JP | 2014138068 | A | * | 7/2014 |
| JP | 6487769 | B2 | | 3/2019 |
| JP | 6637002 | B2 | | 1/2020 |
| JP | 6637003 | B2 | | 1/2020 |
| JP | 2020-035824 | A | | 3/2020 |
| JP | 2020-068261 | A | | 4/2020 |

OTHER PUBLICATIONS

International Search Report issued in International Application No. PCT/JP2021/035020, mailed Dec. 21, 2021, 5 pages.

* cited by examiner 213  213b    213a    213b    213a    213b

T1  T2

230

213a

210

213b    230    213b

213b

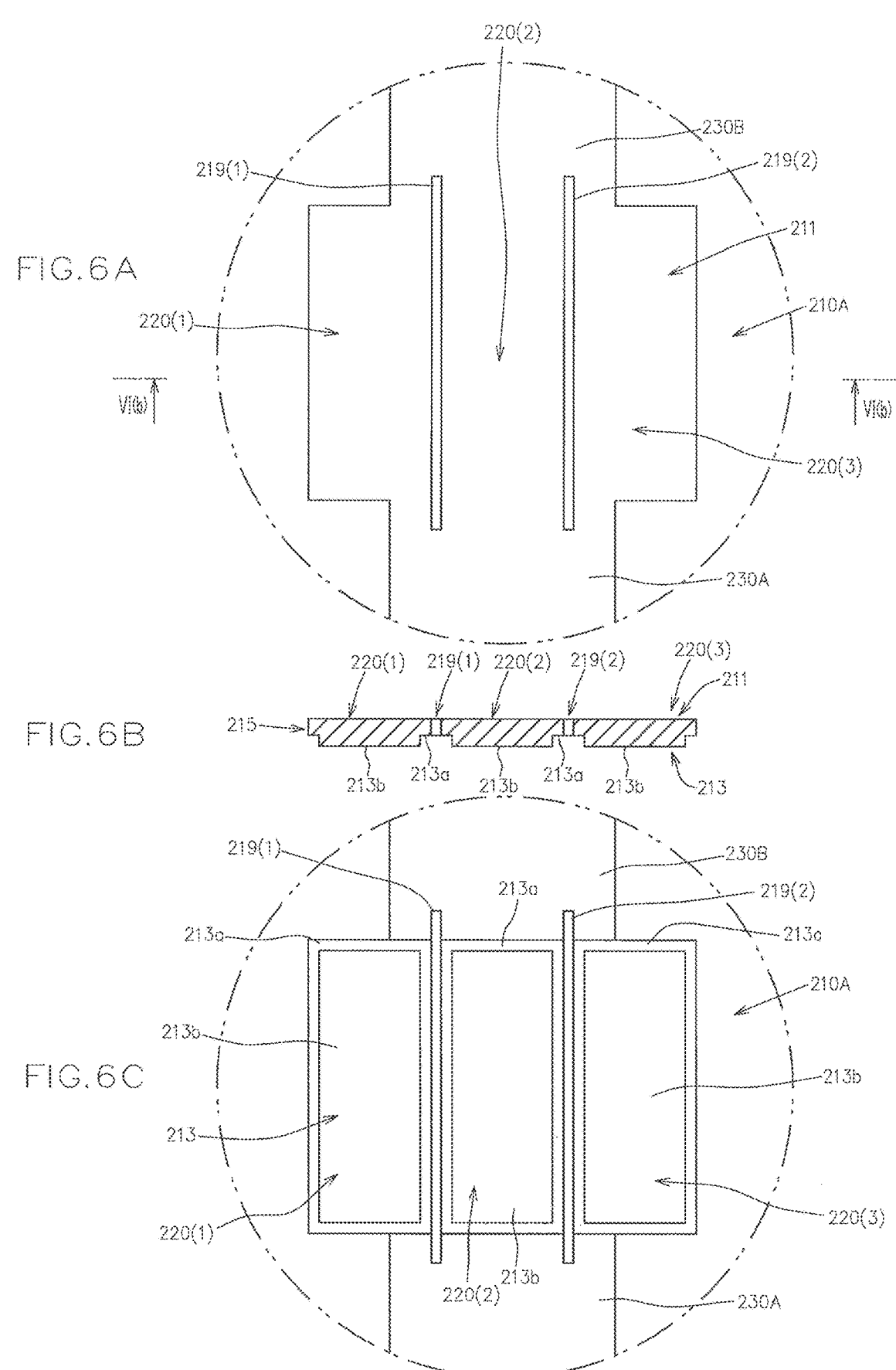

METHOD FOR MANUFACTURING BUSBAR ASSEMBLY

FIELD OF THE INVENTION

The present invention relates to a busbar assembly in which a plurality of busbars are electrically insulated and mechanically connected to one another, and a method for manufacturing the same.

BACKGROUND ART

Busbar assemblies in which a plurality of busbars are mutually electrically insulated and mechanically connected are proposed, and are used in various fields.

For example, there are proposed laminated-type busbar assemblies in which a first flat plate busbar and another second flat plate busbar in parallel with each other are vertically laminated (see Patent Literatures 1 and 2 below).

Since, in the laminated-type busbar assembly, the entirety of the opposing flat surface of the first flat plate busbar and the entirety of the opposing flat surface of the second flat plate busbar are disposed to face each other with an insulating resin therebetween, it is difficult to ensure sufficient reliability in electric insulating property.

In particular, if the insulating resin between the first and second flat plate busbars is made thin in order to downsize the busbar assembly in the vertical direction, there is a risk that a leakage current flows between the first and second busbars.

In order to solve the problems of the above laminated-type busbar assembly, the present applicant has filed applications for a planar-type busbar assembly in which first and second busbars of conductive metal flat plates are arranged in parallel in a common plane, and has obtained patens (see Patent Literatures 3 and 4 below).

By the way, a semiconductor module in which a semiconductor element such as LED is mounted on a busbar assembly is provided with a sealing resin body that surrounds the semiconductor element and a wire connected to the semiconductor (see Patent Literature 5 below).

FIGS. 17A and 17B show a vertical cross-sectional view of a semiconductor module 600 including a busbar assembly 500 that the present applicant has proposed, and a cross-sectional view taken along the line XVII(b)-XVII(b) in FIG. 17A, respectively.

The semiconductor module 600 shown in FIGS. 17A and 17B includes the planar-type busbar assembly 500, the LED 110 mounted on the planar-type busbar assembly 500, and a sealing resin body 130 provided so as to surround the LED 110.

The planar-type busbar assembly 500 has first and second busbars 510(1), 510(2) arranged in parallel in a common plane with a gap 519 therebetween, and an insulative resin layer 520 including a gap filling portion 529 filled into the gap 19, and a top-surface-side laminated portion 521 and a bottom-surface-side laminated portion 525 that extends integrally from the gap filling portion 529 so as to cover top and bottom surfaces of the first and second busbars 510(1), 510 (2), respectively.

The top-surface-side laminated portion 521 is provided with first and second top-surface-side central opening 522 (1), 522(2) that expose predetermined parts of the top surfaces of the first and second busbars 510(1), 510(2), respectively, and a top-surface-side peripheral opening 523 that surrounds the first and second top-surface-side central opening 522(1), 522(2) in a plan view.

Out of the top surface 511 of the first busbar 510(1), a region that is exposed through the first top-surface-side central opening 522(1) forms a top-surface-side connection portion 512 of the first busbar 510(1). Out of the top surface 511 of the second busbar 510(2), a region that is exposed through the second top-surface-side central opening 522(2) forms a top-surface-side connection portion 512 of the second busbar 510(2).

The LED includes an element main body 115, and an upper electrode layer 111 and a lower electrode layer 112 on one side and the other side of the element main body 115 in the thickness direction. The lower electrode layer 112 is mechanically and electrically connected, via, for example, a plated layer (not illustrated), to the top-surface-side connection portion 512 of one (the first busbar 510(1) in FIGS. 17A and 17B) of the first and second busbars 510(1), 510(2), and the upper electrode layer 111 is electrically connected, via a wire 120, to the other one (the second busbar 510(2) in FIGS. 17A and 17B) of the first and second busbars 510(1), 510(2).

The sealing resin body 130 is a member for protecting the LED 110 and the wire 120, and is formed by applying an insulating resin material so as to cover the LED 110 and the wire 120 and then curing the applied insulating resin material.

In the busbar assembly 500, an outer edge of the top-surface-side peripheral opening 523 acts as a damming structure that prevents the sealing resin body 130 from flowing out.

A bottom surface 513 of each of the busbars 510(1), 510(2) includes a first bottom surface region 513a located at the same position as a lower end portion of the gap 519 in a thickness direction, and a second bottom surface region 513b located lower than the first bottom surface region 513a (that is, farther away from the top surface 511 than the first bottom surface region 513a).

The bottom-surface-side laminated portion 525 is provided on the first bottom surface region 513a.

The second bottom surface region 513b extends downward so as to be located lower than the bottom-surface-side laminated portion 525 and is exposed outwardly so that the second bottom surface region 513b acts as a bottom-surface-side connecting portion for electrically connecting the corresponding first and second busbars 510(1), 510(2) to an external member.

According to the configuration, it is possible to utilize the second bottom surface regions 513b of the first and second busbars 510(1), 510(2) as a mounting surface for fixing the busbar assembly 500 (the semiconductor module 600) to an installation surface such as a substrate so that the busbar assembly 500 (the semiconductor module 600) can be fixed in a state where the first and second busbars 510(1), 510(2) has a good parallelism to each other.

PRIOR ART DOCUMENT

Patent Literature

Patent Literature 1: Japanese Patent No. 4432913
Patent Literature 2: Japanese Patent No. 6487769
Patent Literature 3: Japanese Patent No. 6637002
Patent Literature 4: Japanese Patent No. 6637003
Patent Literature 5: Japanese Patent Publication No. 2020-035824

SUMMARY OF THE INVENTION

It is an object of the present invention to provide a manufacturing method capable of manufacturing a busbar assembly in an efficient manner, the busbar assembly including a plurality of busbars disposed in parallel in a common plane and an insulative resin layer including a gap filling portion filled into a gap between the adjacent busbars and a bottom-surface-side laminated portion extending integrally from the gap filling portion so as to be arranged on bottom surfaces of the plurality of busbars, wherein a top surface of each of the busbars is at least partially exposed to form a top-surface-side connection portion, and wherein the bottom surface of the busbar includes a first bottom surface region which is located at the same position in a thickness direction as a lower end portion of the gap and on which the bottom-surface-side laminated portion is arranged and a second bottom surface region which is located farther away from the top surface than the first bottom surface region and is exposed to the outside to form a bottom-surface-side connection portion.

In order to achieve the object, the present invention provides a method for manufacturing a busbar assembly including a plurality of busbars each formed by a conductive flat plate member and disposed in a common plane with a gap provided between lateral surfaces facing one another, and an insulative resin layer including a gap filling portion filled into the gap and a bottom-surface-side laminated portion extending integrally from the gap filling portion so as to be arranged on bottom surfaces of the plurality of busbars, wherein a top surface of each of the busbars is at least partially exposed to form a top-surface-side connection portion, and wherein the bottom surface of the busbar includes a first bottom surface region which is located at the same position in a thickness direction as a lower end portion of the gap and on which the bottom-surface-side laminated portion is arranged, and a second bottom surface region which is located farther away from the top surface than the first bottom surface region and is exposed to the outside to form a bottom-surface-side connection portion, the manufacturing method including: a step of preparing a conductive metal busbar-directed flat plate having a busbar assembly forming area that has a planar shape corresponding to a busbar-connected body in which the plurality of busbars are connected to one another by the busbar-side insulating layer and that has the same thickness as a thickness between the top surface and the second bottom surface region; a thickness adjustment step of adjusting the thickness of the busbar assembly forming region such that a thickness of a first-bottom-surface-region forming area, out of a bottom surface of the busbar assembly forming region, that corresponds to the first bottom surface region is made to coincide with a thickness between the top surface and the first bottom surface region of the busbar; a slit forming step that is performed after or before the thickness adjustment step and that is configured so as to form one or a plurality of slits that penetrate the busbar assembly forming region in the thickness direction and have the same width as the gap so that the busbar assembly forming region is divided into a plurality of busbar forming parts corresponding to the plurality of busbars; a busbar-side insulating layer forming step of applying an insulating resin coating material at least into the inside of the slits and to the entire area of the bottom surface of the busbar assembly forming region and then curing the applied insulating resin coating material to form the busbar-side insulating layer; a laser light irradiation step of irradiating the laser light to, within a range that does not include the slit, at least an entire area of a second-bottom-surface-region forming area corresponding to the second bottom region and a boundary between the first-bottom-surface-region forming area and the second-bottom-surface-region forming area to expose the entire area of the second-bottom-surface-region forming area; and a cutting step of cutting the busbar assembly forming region from the busbar-directed flat plate.

The method for manufacturing the busbar assembly according to the present invention makes it possible to manufacture the busbar assembly in an efficient manner, the busbar assembly including a plurality of busbars disposed in parallel in a common plane and an insulative resin layer including a gap filling portion filled into a gap between the adjacent busbars and a bottom-surface-side laminated portion extending integrally from the gap filling portion so as to be arranged on bottom surfaces of the plurality of busbars, wherein a top surface of each of the busbars is at least partially exposed to form a top-surface-side connection portion, and wherein the bottom surface of the busbar includes a first bottom surface region which is located at the same position in a thickness direction as a lower end portion of the gap and on which the bottom-surface-side laminated portion is arranged and a second bottom surface region which is located farther away from the top surface than the first bottom surface region and is exposed to the outside to form a bottom-surface-side connection portion.

For example, the busbar-side insulating layer forming step is configured so as to form the insulating layer onto the entire area of the top surface of the busbar assembly forming region, in addition to into the inside of the slit and onto the entire area of the bottom surface of the busbar assembly forming region.

In this case, the laser light irradiation step is configured to irradiate laser light to a top-surface-side connection portion forming region, out of the top surface of the busbar assembly forming region, that corresponds to the top-surface-side connection portion so that the top-surface-side connection portion forming region is exposed.

In a preferable configuration, the busbar-directed flat plate is configured to integrally include a plurality of the busbar assembly forming regions arranged in series in a first direction along the slit and a coupling region coupling the adjacent busbar assembly forming regions.

In this case, the slit formed in one of the busbar assembly forming regions is configured to have one side, in the longitudinal direction, that extends into one of the coupling regions coupled to one side of the one busbar assembly forming region in the longitudinal direction, and the other side, in the longitudinal direction, that extends into another one of coupling regions coupled to the other side of the one busbar assembly forming region in the longitudinal direction.

In one embodiment, the manufacturing method according to the present invention may include a frame body forming process that is executed before, after, or in parallel with the processes from the step of preparing the busbar-directed flat plate until the laser light irradiation step; and a flat plate fixing step that is excused after the frame body forming process and after the busbar-side insulating layer forming step.

The frame body forming process is configured to include a step of preparing a conductive metal frame-body-directed flat plate including a frame body forming region having an outer shape corresponding to the busbar assembly forming region in a plan view, a punching step of punching out a center of the frame body forming region so that, when the frame body forming region is superimposed on the busbar assembly forming region, at least the top-surface-side connection portion forming region is exposed upward while being surrounded by the frame body in a plan view, and a frame-body-side insulating layer forming step of applying an insulating resin coating material to at least the bottom surface of the frame body forming region whose center is punched out and then curing the applied insulating resin coating material to obtain a frame-body-side insulating layer.

The flat plate fixing step is configured so as to have the bottom surface of the frame body forming region after the frame body forming process fixed to the top surface of the busbar assembly forming regions after the busbar-side insulating layer forming step.

The cutting step is configured so as to cut, after the flat plate fixing step, the busbar assembly forming region and the frame body forming region that are fixed to each other from the busbar-directed flat plate and the frame-body-directed flat plate.

In the one embodiment, the busbar-directed flat plate is preferably configured to integrally include a plurality of the busbar assembly forming regions arranged in series in a first direction along the slit and a coupling region coupling the adjacent busbar assembly forming regions. The slit formed in one of the busbar assembly forming regions is preferably configured to have one side, in the longitudinal direction, that extends into one of the coupling regions coupled to one side of the one busbar assembly forming region in the longitudinal direction, and the other side, in the longitudinal direction, that extends into another one of coupling regions coupled to the other side of the one busbar assembly forming region in the longitudinal direction. The frame-body-directed flat plate is preferably configured to integrally include a plurality of the frame body forming regions arranged in series in the first direction at the same pitch as the plurality of busbar assembly forming regions, and a coupling region coupling the adjacent frame body forming regions in the first direction.

In the one embodiment, the flat plate fixing step may be performed after the laser light irradiation step.

Alternatively, it is possible to perform the laser light irradiation step after the flat plate fixing step.

The present invention also provides a busbar assembly including a plurality of busbars each formed by a conductive flat plate member that includes a top surface and a bottom surface facing one side and the other side in a thickness direction, respectively, and lateral surfaces coupling the top surface and the bottom surface, the plurality of busbars being disposed in a common plane with a gap provided between the lateral surfaces facing one another, an insulative resin layer including a gap filling portion filled into the gap and a bottom-surface-side laminated portion extending integrally from the gap filling portion so as to be arranged on a bottom surface of a busbar-connected body that is formed by the plurality of busbars connected to one another by the gap filling portion, a frame body fixed to a peripheral edge of the top surface of the busbar-connected body so as to surround, in a plan view, a center region of the top surface of the busbar-connected body, the frame body having an insulative property at least at a bottom surface that is fixed to the top surface of the busbar-connected body, wherein at least a part of the top surface of the busbar within a region that is surrounded by the frame body is exposed to form a top-surface-side connection portion, and wherein the bottom surface of the busbar includes a first bottom surface region which is located at the same position in a thickness direction as a lower end portion of the gap on the other side in the thickness direction and on which the bottom-surface-side laminated portion is arranged, and a second bottom surface region which is exposed to the outside and is located on the other side in the thickness direction farther than the bottom-surface-side laminated portion.

In a preferably configuration, the busbar-side insulating layer may include a top-surface-side laminated portion extending integrally from the gap filling portion so as to be positioned on the top surface of the busbar-connected body.

The top-surface-side laminated portion is provided with an opening for exposing the top-surface-side connection portion.

In a first embodiment of the busbar assembly according to the present invention, the first bottom surface region is configured extend along the entire peripheral edge of the bottom surface of the busbar, and the busbar-side insulating layer is configured to include a lateral-surface-side laminated portion extending integrally from the bottom-surface-side laminated portion so as to cover a lateral surface of the busbar-connected body.

In a second embodiment of the busbar assembly according to the present invention, the first bottom surface regions is only present in a region along the lateral surface facing the gap in the peripheral edge of the bottom surface of the busbar.

In any of the various configurations of the busbar assembly according to the present invention, the frame body may be formed by an insulating member.

Alternatively, the frame body may be formed by a conductive member, and the frame body is provided at least at a bottom surface with a frame-body-side insulating layer.

BRIEF DESCRIPTION OF THE DRAWINGS

FIGS. 6A to 6C are an enlarged view of a portion VI(a) in FIG. 5, a cross-sectional view taken along the line VI(b)-VI(b) in FIG. 6A, and a bottom view of FIG. 6B, respectively.

EMBODIMENT FOR CARRYING OUT THE INVENTION

An embodiment of a method of manufacturing a busbar assembly according to the present invention will be described below with reference to the accompanying drawings.

Figure 1:
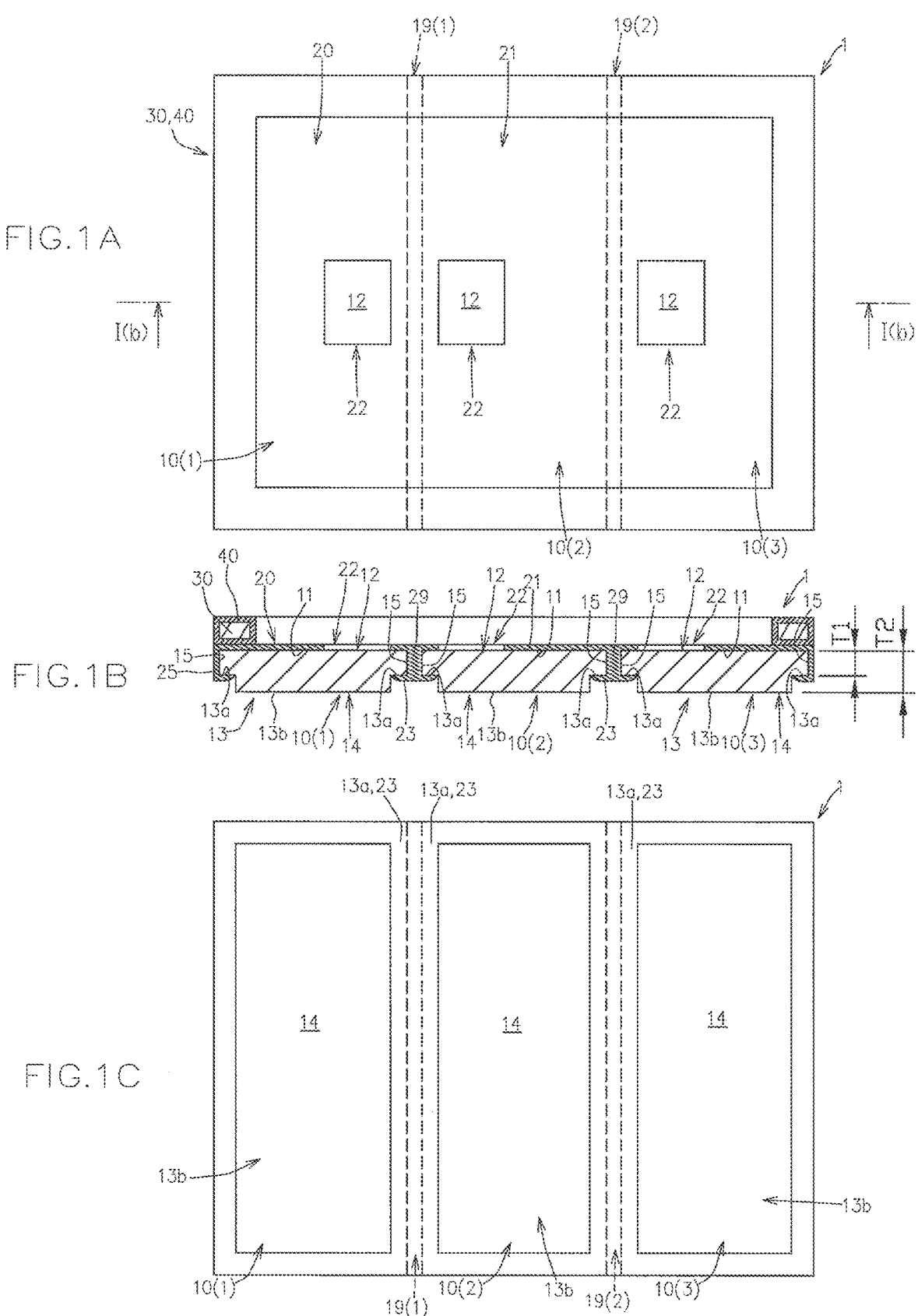
FIGS. 1A to 1C are a plan view of a busbar assembly manufactured by a manufacturing method according to one embodiment of the present invention, a cross-sectional view taken along the line I(b)-I(b) in FIG. 1A, and a bottom view of the busbar assembly, respectively.

FIGS. 1A to 1C respectively illustrate a plan view of a busbar assembly 1 manufactured by the manufacturing method according to the present embodiment, a cross-sectional view taken along the line I(b)-I(b) in FIG. 1A, and a bottom view of the busbar assembly 1.

As illustrated in FIGS. 1A to 1C, the busbar assembly 1 includes a plurality of busbars 10 formed of a conductive flat plate member and arranged in parallel in the same plane with a gap 19 between lateral surfaces 15 facing each other, and a busbar-side insulating layer 20 including a gap filling portion 29 filled into the gap 19 and a bottom-surface-side laminated portion 23 extending integrally from the gap filling portion 29 so that the bottom-surface-side laminated portion 23 is arranged on a bottom surface of a busbar-connected body that is formed by the plurality of busbars 10 connected to one another by the gap filling portion 29.

Each of the busbars 10 is formed of a conductive metal such as Cu, for example.

The busbar assembly 1 according to the present embodiment includes three busbars as the plurality of busbars 10, that is, first to third busbars 10(1) to 10(3), and includes, as the gap 19, first and second gaps 19(1) and 19(2).

That is, the busbar assembly 1 includes the first busbar 10(1), the second busbar 10(2) arranged adjacent to the first busbar 10(1) via the first gap 19(1), and the third busbar 10(3) arranged adjacent to the second busbar 10(2) via the second gap 19(2).

Each of the busbars 10(1) to 10(3) includes a top surface 11 and a bottom surface 13 facing one side and the other side in a thickness direction, respectively, and the lateral surfaces 15 coupling the top surface 11 and the bottom surface 13.

The lateral surfaces 15 of adjacent ones of the busbars 10 face each other via the gap 19.

At least a part of the top surface 11 of the busbar 10 is exposed to form a top-surface-side connection portion 12.

The top-surface-side connection portion 12 functions as an element connection portion to which a semiconductor element 110 (see FIG. 2 below) such as an LED mounted to the busbar assembly 1 is mounted or electrically connected.

On the other hand, as illustrated in FIG. 1B, the bottom surface 13 of each of the busbars 10(1) to 10(3) includes a first bottom surface region 13a which is located at the same position in a thickness direction as a lower end portion of the gap 19 on the other side in the thickness direction and on which the bottom-surface-side laminated portion 23 is arranged, and a second bottom surface region 13b which is exposed to the outside and is located on the other side in the thickness direction farther than the bottom-surface-side laminated portion 23 arranged on the first bottom surface region 13a (that is, located farther away from the top surface 11 than the bottom-surface-side laminated portion 23 arranged on the first bottom surface region 13a is).

The second bottom surface region 13b functions as an external connection portion 14 for electrically connecting a corresponding one of the busbars 10 to the outside, and also serves as a mounting surface when the busbar assembly 1 is fixed to an installation surface such as a substrate.

As described above, the second bottom surface region 13b protrudes lower than the bottom-surface-side laminated portion 23. Therefore, by utilizing the second bottom surface region 13b as the mounting surface, it is possible to stabilize a fixed posture of the busbar assembly 1.

In the present embodiment, as illustrated in FIG. 1C, the first bottom surface region 13a extends along the entire peripheral edge of the bottom surface of each of the busbars 10, and a central region of the bottom surface of each of the busbars 10 surrounded by the first bottom surface region 13a serves as the second bottom surface region 13b.

The busbar-side insulating layer 20 is formed of an insulating resin coating film having heat resistance and insulating properties such as polyamideimide, polyimide, polyamide, and epoxy, and is preferably suitably formed by using INSULEED (registered trademark).

As illustrated in FIGS. 1A and 1B, in the present embodiment, the busbar-side insulating layer 20 includes a top-surface-side laminated portion 21, in addition to the gap filling portion 29 and the bottom-surface-side laminated portion 23.

The top-surface-side laminated portion 21 extends integrally from the gap filling portion 29 so as to be positioned on a top surface of the busbar-connected body formed by coupling the plurality of busbars 10(1) to 10(3) by the gap filling portion 29.

In this case, an opening 22 for exposing the top-surface-side connection portion 12 is provided in the top-surface-side laminated portion 21.

In the present embodiment, the busbar-side insulating layer 20 further includes a lateral-surface-side laminated portion 25 that covers a lateral surface of the busbar-connected body.

As described above, in the present embodiment, the first bottom surface region 13a on which the bottom-surface-side laminated portion 23 is provided extends along the entire peripheral edge of the bottom surface of each busbar 10, and the lateral-surface-side laminated portion 25 extends integrally from a portion of the bottom-surface-side laminated portion 23 located at the peripheral edge of the bottom surface of the busbar-connected body.

According to such a configuration, it is possible to effectively prevent the busbar-side insulating layer 20 from detaching from the busbar-connected body.

In the present embodiment, the lateral-surface-side laminated portion 25 is also integrally formed with the top-surface-side laminated portion 21.

As illustrated in FIGS. 1A and 1B, the busbar assembly 1 further includes a frame body 30.

The frame body 30 is a member for holding a sealing resin body 130 (see FIG. 2 below) that protects the semiconductor element 110 (see FIG. 2 below) such as an LED mounted on the top-surface-side connection portion 12 and a wire 120 (see FIG. 2 below) connected to the semiconductor element 110.

Specifically, the frame body 30 is fixed to the peripheral edge of the busbar-connected body to integrally surround at least the top-surface-side connection portions 12 of the busbars 10(1) to 10(3) in a plan view.

That is, the frame body 30 has the same outer shape as the busbar-connected body in a plan view, and is formed as an annular-shaped body provided with a central hole opening the top-surface-side connection portions 12 of the plurality of busbars 10(1) to 10(3) upward.

The frame body 30 is fixed to the busbar-connected body in a state of being insulated from the plurality of busbars 10(1) to 10(3).

In the present embodiment, the frame body 30 is formed of a conductive metal member (preferably the same member as the busbar 10), and is provided with a frame-body-side insulating layer 40 on an outer peripheral surface.

That is, in the present embodiment, the frame body 30 formed of the conductive metal member is fixed to the peripheral edge of the top surface of the busbar-connected body in a state of being insulated from the plurality of busbars 10(1) to 10(3) via the frame-body-side insulating layer 40 and the top-surface-side laminated portion 21 of the busbar-side insulating layer 20.

Alternatively, the frame body 30 can be formed of an insulating member such as ceramics.

Further, such as in the present embodiment, in a configuration in which the top-surface-side laminated portion 21 is provided on the top surface of the busbar-connected body, it is also possible to omit the frame-body-side insulating layer 40, while forming the frame body 30 from a conductive member.

In a configuration in which the top-surface-side laminated portion 21 is not provided, it is also possible to provide the frame-body-side insulating layer 40 only on a bottom surface of the frame body 30, while forming the frame body 30 from a conductive member.

Figure 2:
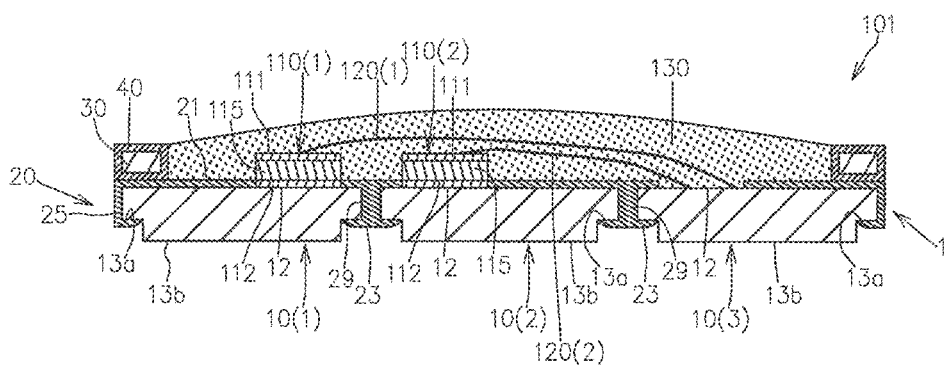
FIG. 2 is a vertical cross sectional view of a semiconductor module in which a semiconductor element such as LED is mounted on the busbar assembly.

FIG. 2 illustrates a vertical cross-sectional view of one example of a semiconductor module 101 in which the semiconductor element 110 such as the LED is mounted on the busbar assembly 1.

In the semiconductor module 101, first and second semiconductor elements 110(1) and 110(2) are mounted as the semiconductor element 110 on the busbar assembly 1.

Each of the first and second semiconductor elements 110(1) and 110(2) includes an upper electrode layer 111 and a lower electrode layer 112 on a top surface on one side in the thickness direction and a bottom surface on the other side in the thickness direction, respectively, and an element main body 115 provided between the upper electrode layer 111 and the lower electrode layer 112.

In the semiconductor module 101, the first and second busbars 10(1) and 10(2) function as a first electrode that forms one electrode among an anode and a cathode (for example, the anode), and the third busbar 10(3) functions as a second electrode that forms the other electrode among the anode and the cathode (for example, the cathode).

That is, in the first semiconductor element 110(1), the lower electrode layer 112 is electrically connected and fixed to the top-surface-side connection portion 12 of the first busbar 10(1) acting as the first electrode, and the upper electrode layer 111 is electrically connected, via a wire 120(1), to the top-surface-side connection portion 12 of the third busbar 10(3) acting as the second electrode.

In the second semiconductor element 110(2), the lower electrode layer 112 is electrically connected and fixed to the top-surface-side connection portion 12 of the second busbar 10(2) acting as the first electrode, and the upper electrode layer 111 is electrically connected, via a wire 120(2), to the top-surface-side connection portion 12 of each of the third busbar 10(3) acting as the second electrode.

Preferably, a plated layer (not illustrated) is provided on the top surfaces of the first to third busbars 10(1) to 10(3).

In this case, the lower electrode layers 112 of the first and second semiconductor elements 110(1) and 110(2) are die-bonded to be electrically connected to the plated layer on the top surfaces of the first and second busbars 10(1) and 10(2), respectively. The upper electrode layers 111 of the first and second semiconductor elements 110(1) and 110(2) are respectively wire-bonded by the first and second wires 120(1) and 120(2) to the plated layer (not illustrated) provided on the top surface of the third busbar 10(3).

The sealing resin body 130 is provided on the top surface of the busbar assembly 1 to surround the first and second semiconductor elements 110(1) and 110(2) and the first and second wires 120(1) and 120(2).

The frame body 30 prevents an insulating resin material forming the sealing resin body 130 from running off before being cured when the sealing resin body 130 is provided, and prevents the sealing resin body 130 from being detached from the busbar assembly 1 after curing.

For example, the sealing resin body 130 is formed of a transparent resin material such as polyimide, polyamide, and epoxy.

A method of manufacturing the busbar assembly 1 according to the present embodiment will be described below.

The manufacturing method includes a step of preparing a busbar-directed flat plate 200 formed of a conductive metal.

Figure 3A:
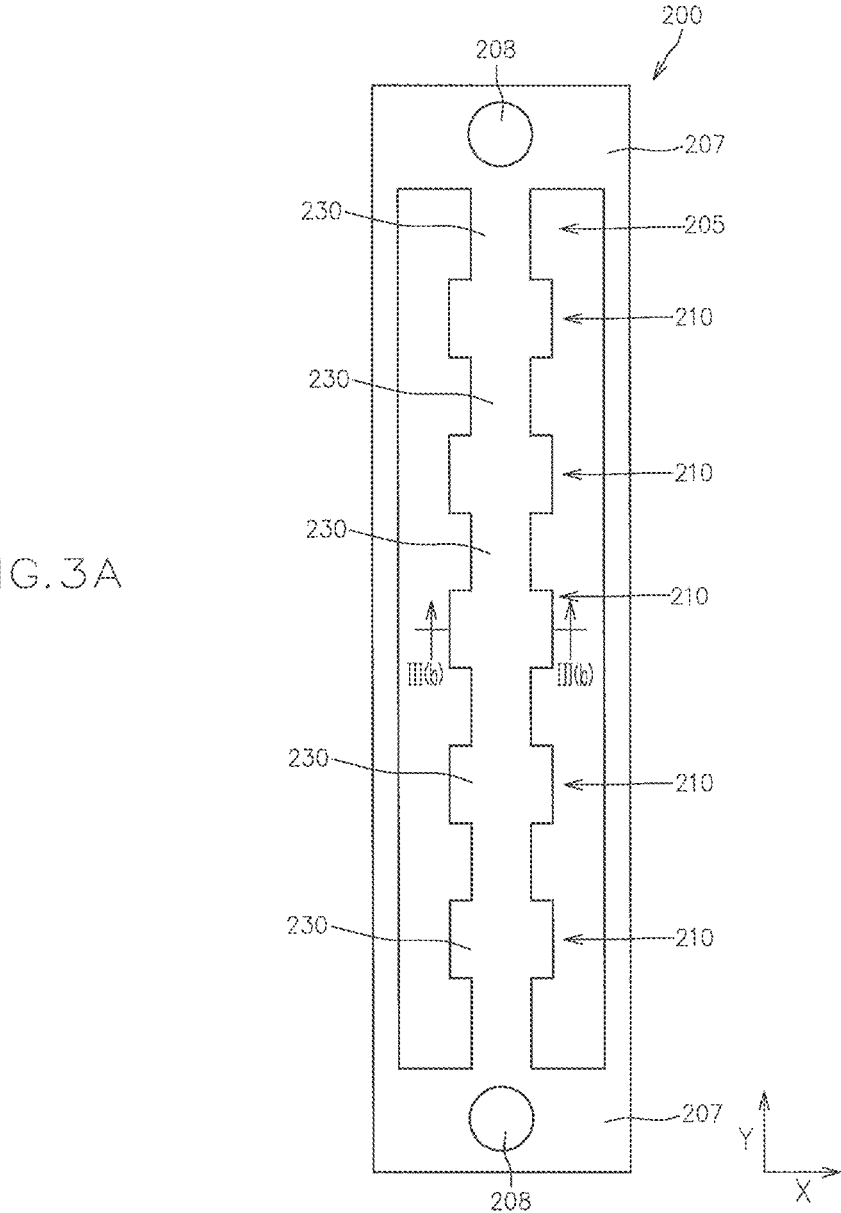
FIGS. 3A and 3B are a plan view of a busbar-directed flat plate used in the manufacturing method and an enlarged cross-sectional view taken along the line III(b)-III(b) in FIG. 3A, respectively.
Figure 3B:
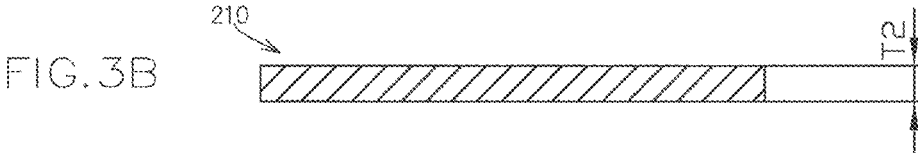

FIGS. 3A and 3B respectively illustrate a plan view of the busbar-directed flat plate 200 and an enlarged cross-sectional view taken along the line III(b)-III(b) in FIG. 3A.

The busbar-directed flat plate 200 includes busbar assembly forming regions 210 each having a planar shape corresponding to the busbar-connected body that is obtained by coupling the plurality of busbars 10 (the first to third busbars 10(1) to 10(3)) by the busbar-side insulating layer 20.

That is, a length of each of the busbar assembly forming regions 210 in a first direction (a Y direction in FIG. 3A) in a plane where the busbar-directed flat plate 200 is located is the same as the length of the busbar assembly 1 in a direction parallel to the gap 19, and a length of the busbar assembly forming region 210 in a second direction (a length in an X direction in FIG. 3A) orthogonal to the first direction in the plane is the same as the length of the busbar assembly 1 in a direction orthogonal to a longitudinal direction of the gap 19.

As illustrated in FIGS. 1B and 3B, a thickness of the busbar assembly forming region 210 is the same as a thickness T2 of the busbar 10 between the top surface 11 and the second bottom surface region 13b.

As illustrated in FIG. 3A, in the present embodiment, the busbar-directed flat plate 200 includes a busbar row 205 including a plurality of the busbar assembly forming regions 210 arranged in series along the first direction (the Y direction) in the plane in which the flat plate 200 is located and coupling regions 230 coupling busbar assembly forming regions 210 adjacent in the Y direction. Therefore, the plurality of busbar assembly forming regions 210 can be processed simultaneously.

In the present embodiment, the busbar-directed flat plate 200 includes a pair of gripping pieces 207 respectively coupled to one side and the other side of the busbar row 205 in the longitudinal direction (the Y direction), and the pair of gripping pieces 207 are provided with alignment holes 208.

A plurality of the busbar rows 205 are arranged in parallel in the second direction (the X direction) in the plane, and the pair of gripping pieces 207 and 207 may integrally hold the plurality of busbar rows 205 arranged in parallel in the X direction.

According to such a modified configuration, more of the busbar assemblies 1 can be manufactured at the same time.

The manufacturing method further includes a thickness adjustment step of adjusting the thickness of the busbar assembly forming region 210.

Figure 4A:
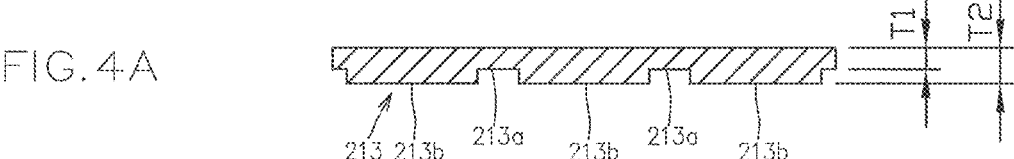
FIGS. 4A and 4B are a vertical cross sectional view and a bottom view of a busbar assembly forming region in the busbar-directed flat plate, respectively, and show a state after a thickness adjustment step of the manufacturing method.

FIG. 4A illustrates a vertical cross-sectional view of the busbar assembly forming region 210 after the thickness adjustment step.

Figure 4B:
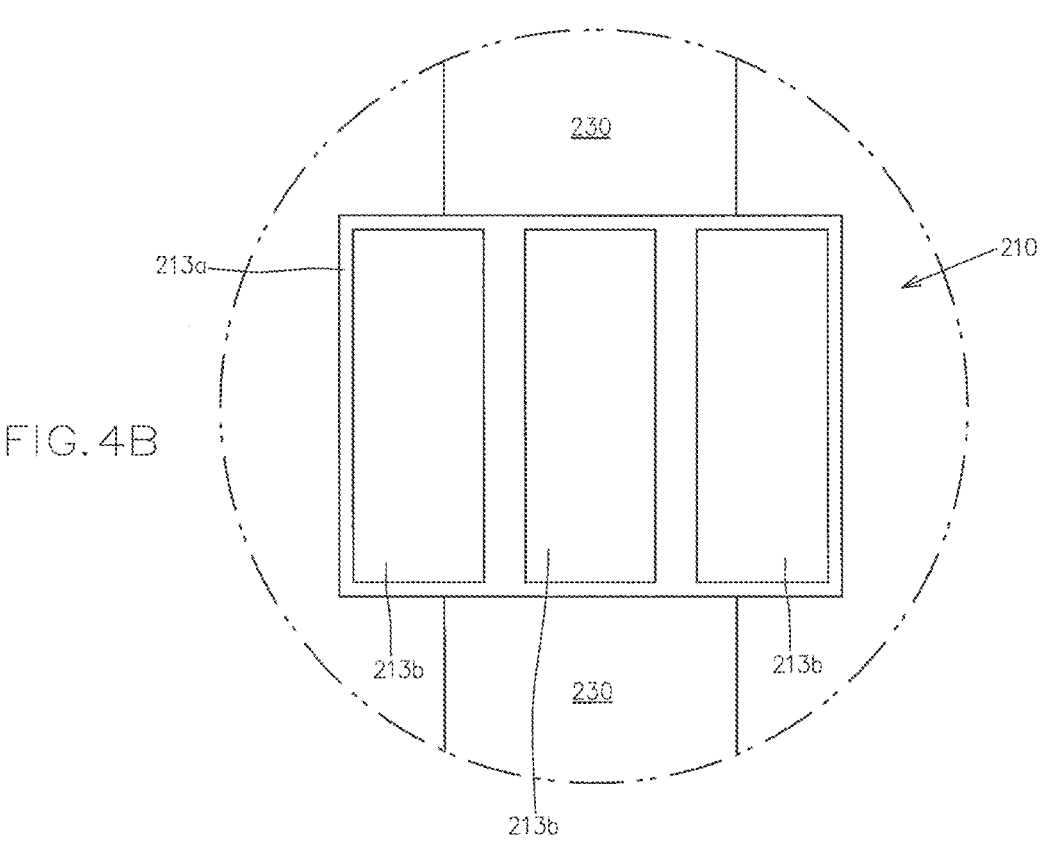

Further, FIG. 4B illustrates a bottom view of the busbar assembly forming region 210 after the thickness adjustment step.

As illustrated in FIGS. 4A and 4B, the thickness adjustment step is configured to cause a thickness of a first-bottom-surface-region forming area 213a corresponding to the first bottom surface region 13a in a bottom surface 213 of the busbar assembly forming region 210 to coincide with a thickness T1 of the busbar 10 between the top surface 11 and the first bottom surface region 13a.

The thickness adjustment step can be performed by laser trimming or etching, for example.

As a result, the thickness of a region of the bottom surface 213 other than the first-bottom-surface-region forming area 213a maintains the thickness T2 and forms a second-bottom-surface-region forming area 213b corresponding to the second bottom surface region 13b.

The manufacturing method further includes a slit forming step.

Figure 5:
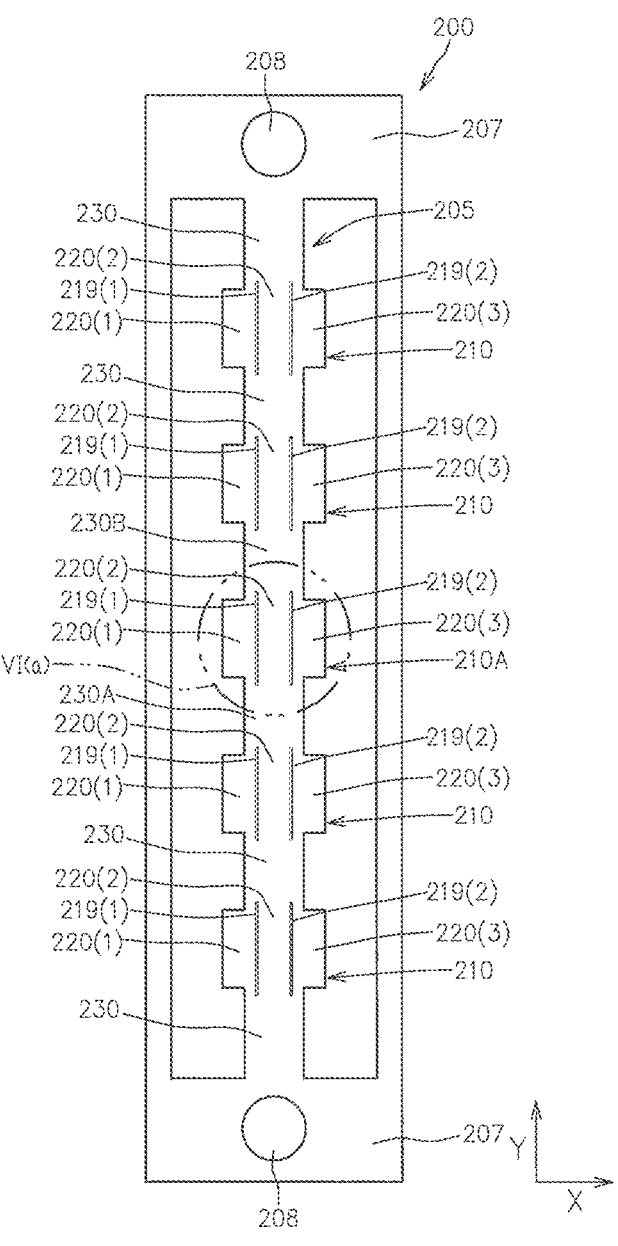
FIG. 5 is a plan view of the busbar-directed flat plate after a slit forming step of the manufacturing method.

FIG. 5 illustrates a plan view of the busbar-directed flat plate 200 after the slit forming step.

FIGS. 6A to 6C respectively illustrate an enlarged view of a portion VI(a) in FIG. 5, a cross-sectional view taken along the line VI(b)-VI(b) in FIG. 6A, and a bottom view of FIG. 6B.

In the present embodiment, the slit forming step is performed after the thickness adjustment step, but alternatively, the slit forming step may be performed before the thickness adjustment step.

The slit forming step is configured so as to form one or a plurality of slits 219 (first and second slits 219(1) and 219(2)) that penetrate the busbar assembly forming region 210 in the thickness direction and have the same width as the gaps 19 (the first and second gaps 19(1) and 19(2)) to divide the busbar assembly forming region 210 into a plurality of busbar forming parts 220 (first to third busbar forming parts 220(1) to 220(3)) corresponding to the plurality of busbars 10 (the first to third busbars 10(1) to 10(3)).

The busbar assembly 1 includes the first gap 19(1) located between the first and second busbars 10(1) and 10(2) and the second gap 19(2) located between the second and third busbars 10(2) and 10(3). Therefore, the slit forming step is configured so as to form the first and second slits 219(1) and 219(2) having the same width as the first and second gaps 19(1) and 19(2), respectively.

As illustrated in FIGS. 6A to 6C, in the present embodiment, the first and second slits 219(1) and 219(2) formed in one busbar assembly forming region 210A each have one side, in the longitudinal direction (the Y direction), that extends into one coupling region 230A coupled to one side of the one busbar assembly forming region 210A in the longitudinal direction (the Y direction), and the other side, in the longitudinal direction (the Y direction), that extends into the other coupling region 230B coupled to the other side of the one busbar assembly forming region 210A in the longitudinal direction (the Y direction).

In a state after the slit forming step, the first to third busbar forming parts 220(1) to 220(3) adjacent to one another via the first and second slits 219(1) and 219(2) formed in the one busbar assembly forming region 210A are maintained in a state of being connected to one another via the one coupling region 230A and the other coupling region 230B.

According to such a configuration, the first and second slits 219(1) and 219(2) (the first and second gaps 19(1) and 19(2)) can be formed with high accuracy.

The manufacturing method includes a busbar-side insulating layer forming step that is performed after the thickness adjustment step and the slit forming step.

Figures 7A, 7B:
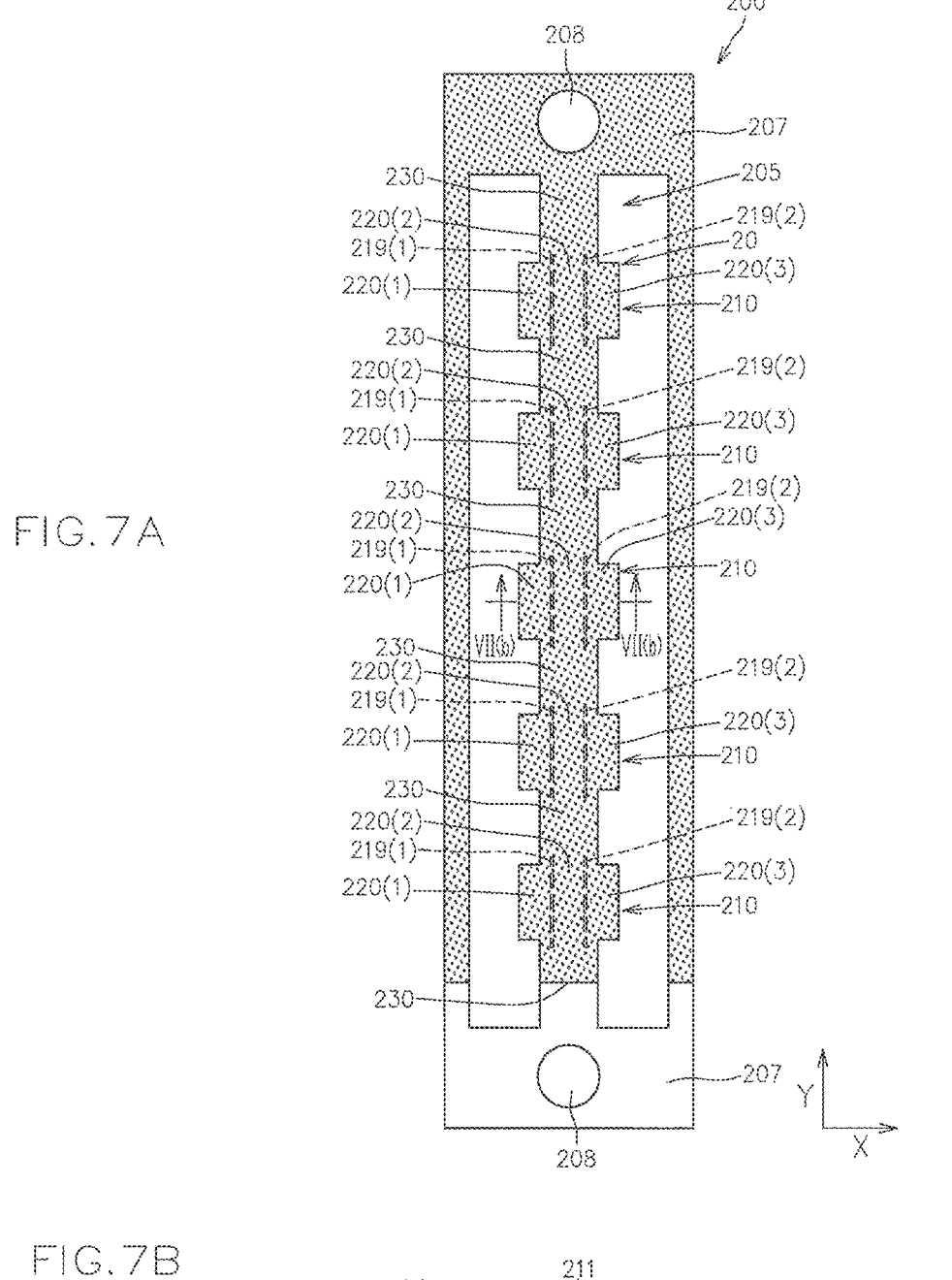
FIGS. 7A and 7B are a plan view of the busbar-directed flat plate after a busbar-side insulating layer forming step of the manufacturing method and an enlarged cross-sectional view taken along the line VII(b)-VII(b) in FIG. 7A.

FIGS. 7A and 7B respectively illustrate a plan view of the busbar-directed flat plate 200 after the busbar-side insulating layer forming step and an enlarged cross-sectional view taken along the line VII(b)-VII(b) in FIG. 7A.

The busbar-side insulating layer forming step is configured so as to apply an insulating resin coating material at least into the inside of the slits 219(1) and 219(2) and to the entire area of the bottom surface 213 of the busbar assembly forming region 210 and then cure the applied insulating resin coating material to form the busbar-side insulating layer 20.

For example, the insulating resin coating material can be applied by electrodeposition coating, electrostatic powder coating, or spray coating.

In the busbar assembly 1, the busbar-side insulating layer 20 includes, in addition to the gap filling portions 29 filled into the gaps 19 and the bottom-surface-side laminated portion 23 provided on the bottom surface of the busbar-connected body, the top-surface-side laminated portion 21 and the lateral-surface-side laminated portion 25 provided on the top surface and the lateral surface of the busbar-connected body, respectively.

Therefore, as illustrated in FIGS. 7A and 7B, the busbar-side insulating layer forming step is configured so as to also apply the insulating resin coating material to a top surface 211 and a lateral surface 215 of the busbar assembly forming region 210 and then cure the applied insulating resin coating material.

The manufacturing method further includes a laser light irradiation step performed after the busbar-side insulating layer forming step.

Figure 8A:
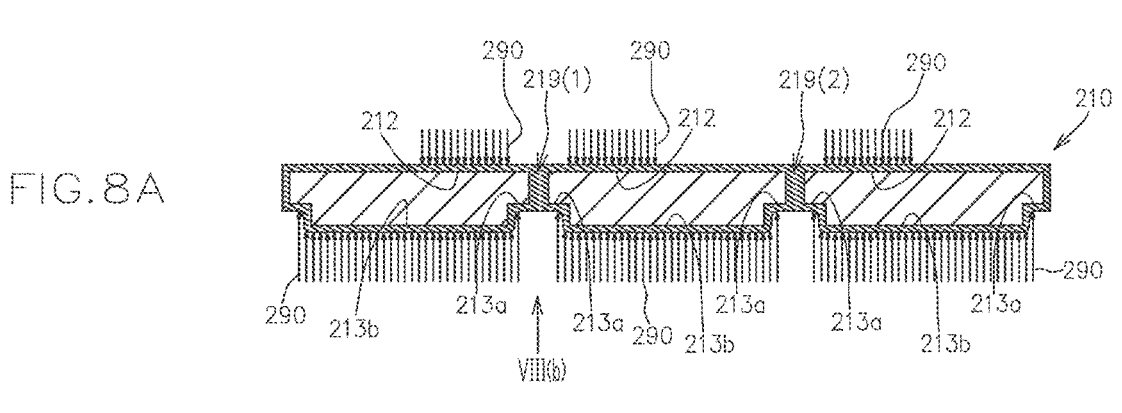
FIG. 8A is a vertical cross-sectional view of the busbar assembly forming region during the laser light irradiation step of the manufacturing method.

FIG. 8A illustrates a vertical cross-sectional view of the busbar assembly forming region 210 in the laser light irradiation step.

Figure 8B:
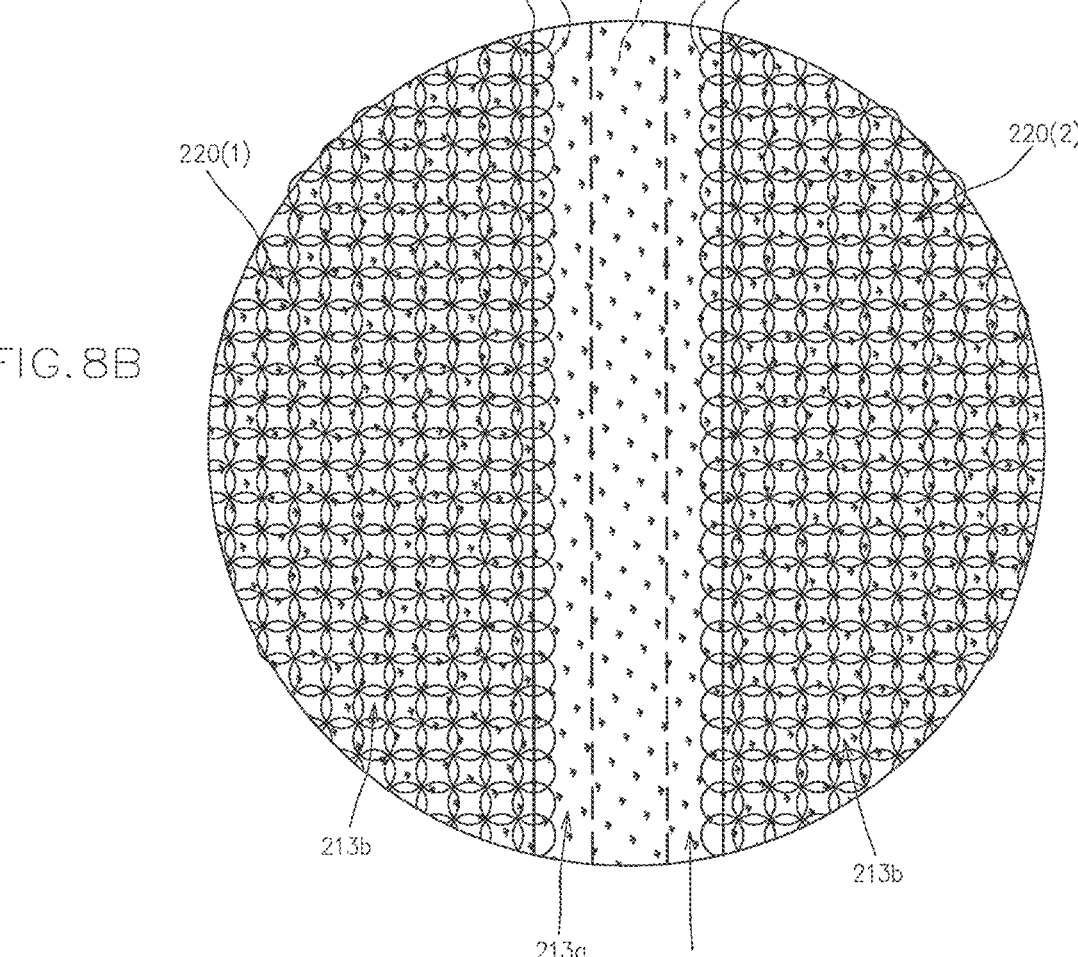
FIG. 8B is a partially enlarged bottom view of the busbar assembly forming region as viewed along the line VIII(b) in FIG. 8A.

FIG. 8B illustrates a partially enlarged bottom view of the busbar assembly forming region 210, as viewed along the line VIII(b) in FIG. 8A.

Reference numerals 291 in FIG. 8B denote irradiation spots to be irradiated with laser light 290.

As illustrated in FIGS. 8A and 8B, the laser light irradiation step is configured such that, within a range not irradiated inside the slit 219, at least the entire area of the second-bottom-surface-region forming area 213b and a boundary 213c between the first-bottom-surface-region forming area 213a and the second-bottom-surface-region forming area 213b are irradiated with the laser light 290 to expose the entire area of the second-bottom-surface-region forming area 213b.

The range not irradiated inside the slit 219 can be easily recognized based on a relationship between a size of the irradiation spot 291 of the laser light 290 and a width of the first-bottom-surface-region forming area 213a adjacent to the slit 219.

As described above, in the busbar assembly 1, the busbar-side insulating layer 20 includes the top-surface-side laminated portion 21 on the top surface of the busbar-connected body.

In this case, the laser light irradiation step includes, in addition to the irradiating the bottom surface 213 of the busbar assembly forming region 210 with laser light for exposing the entire area of the second-bottom-surface-region forming area 213b, irradiating the top surface of the busbar assembly forming region 210 with laser light for exposing the top-surface-side connection portion 12 in which a top-surface-side connection portion forming region 212 corresponding to the top-surface-side connection portion 12 in the top surface 211 of the busbar assembly forming region 210 is irradiated with laser light.

Figures 9A, 9B:
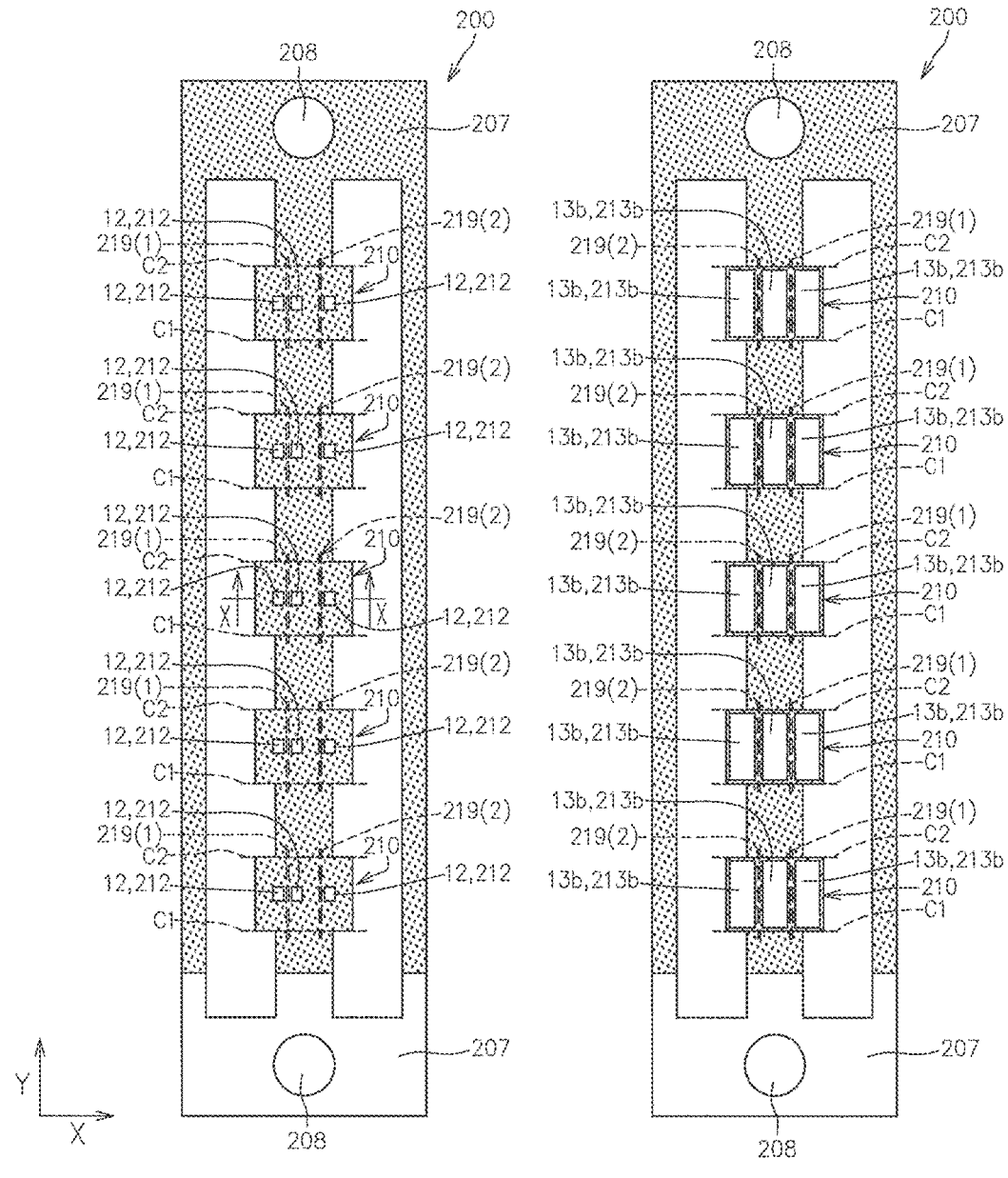
FIGS. 9A and 9B are a plan view and a bottom view of the busbar-directed flat plate after the laser light irradiation step, respectively.

FIGS. 9A and 9B respectively illustrate a plan view and a bottom view of the busbar-directed flat plate 200 after the laser light irradiation step.

Figure 10:
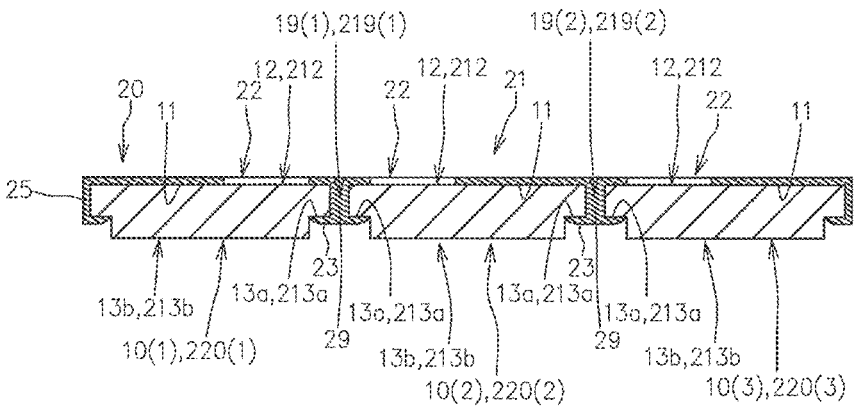
FIG. 10 is a cross-sectional view taken along the line X-X in FIG. 9A.

FIG. 10 illustrates a cross-sectional view taken along the line X-X in FIG. 9A.

By providing the laser light irradiation step, the gap filling portions 29 filled in the slits 219 (that is, the gaps 19) are effectively prevented from being scraped off, and it is possible to prevent the busbar-side insulating layer 20 from remaining in the second-bottom-surface-region forming area 213b (that is, the second bottom surface region 13b).

According to the manufacturing method, it is possible to efficiently manufacture the planar-type busbar assembly 1 having a planar shape in which the second bottom surface regions 13b forming bottom-surface-side connecting portions 14 of the plurality of busbars 10(1) to 10(3) have a good parallelism to one another.

The manufacturing method includes a cutting step of cutting the busbar assembly forming region 210 from the busbar-directed flat plate 200 after the laser light irradiation step.

As illustrated in FIGS. 9A and 9B, the cutting step is configured to cut the busbar-directed flat plate 200 at cutting lines C1 and C2 along edges on one side and the other side of the busbar assembly forming regions 210 in the Y direction.

As described above, the busbar assembly 1 includes the frame body 30 (see FIGS. 1A to 1C and 2).

Therefore, the manufacturing method includes a frame body forming process for forming the frame body 30.

The frame body forming process is executed before, after, or in parallel with the processes from the step of preparing the busbar-directed flat plate 200 to the laser light irradiation step.

Figure 11:
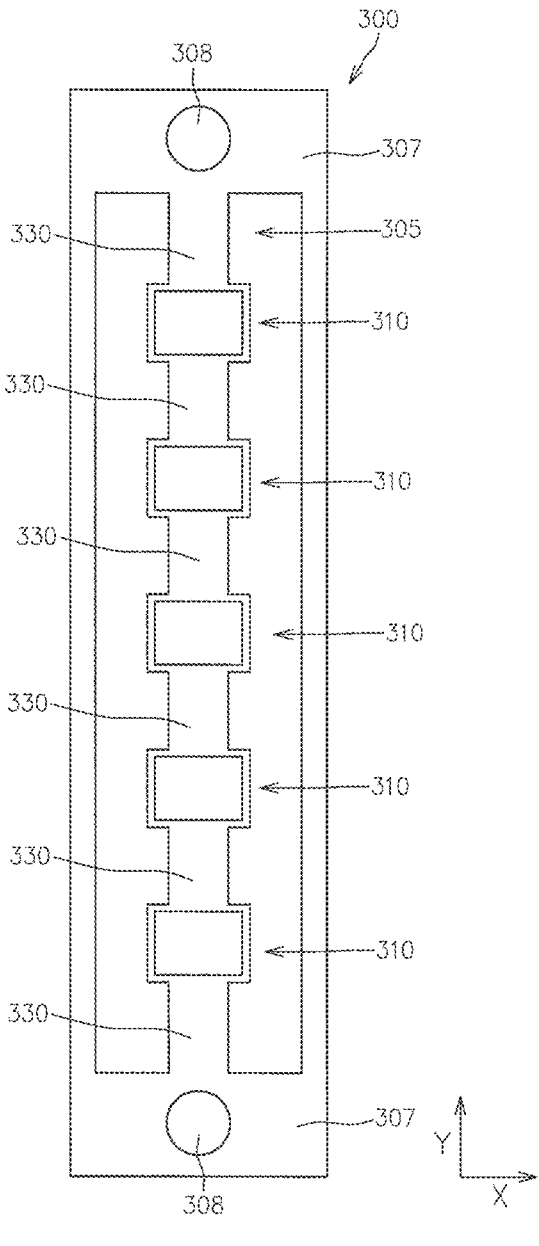
FIG. 11 is a plan view of a frame-body-directed flat plate used in a frame body forming process of the manufacturing method.

FIG. 11 illustrates a plan view of a frame-body-directed flat plate 300 used in the frame body forming process.

The frame body forming process includes a step of preparing the frame-body-directed flat plate 300 formed of a conductive metal and including frame body forming regions 310 having the same thickness as the frame body 30 and having an outer shape corresponding to the busbar assembly forming regions 210 in a plan view, a punching step of punching out centers of the frame body forming regions 310 so that, when the frame body forming regions 310 are superimposed on the busbar assembly forming regions 210, at least the top-surface-side connection portion forming region 212 is exposed upward while being surrounded in a plan view, and a frame-body-side insulating layer forming step of applying an insulating resin coating material to at least the bottom surfaces of the frame body forming regions 310 in which the centers are punched out and curing the applied insulating resin coating material to obtain the frame-body-side insulating layer 40.

Note that FIG. 11 illustrates a state after the punching step.

Figure 12:
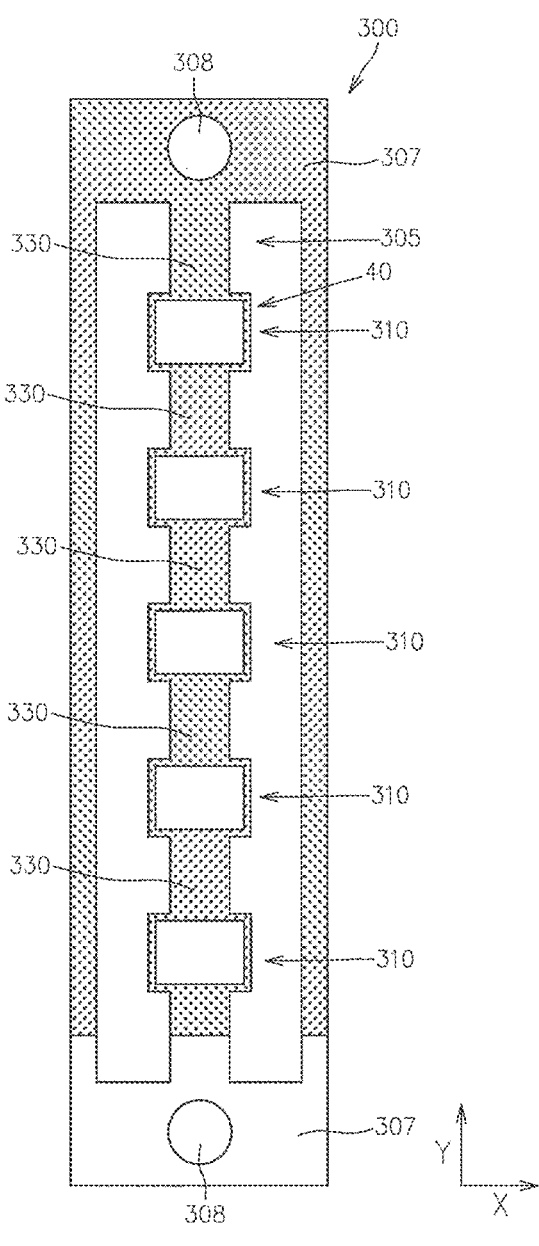
FIG. 12 is a plan view of the frame-body-directed flat plate after a frame-body-side insulating layer forming step of the manufacturing method.

FIG. 12 illustrates a plan view of the frame-body-directed flat plate 300 after the frame-body-side insulating layer forming step.

In the present embodiment, the frame-body-side insulating layer forming step is configured so that an insulating resin coating material is applied to the entire periphery of the frame body forming regions 310 in which the centers are punched out and the applied insulating resin coating material is cured to form the frame-body-side insulating layer 40 around the entire periphery of the frame body forming regions 310.

The frame-body-directed flat plate 300 may be formed of various rigid materials.

Preferably, the frame-body-directed flat plate 300 is formed of the same material as the busbar-directed flat plate 200.

The frame-body-directed flat plate 300 is configured such that the frame body forming regions 310 are aligned with the busbar assembly forming regions 210 when the frame-body-directed flat plate 300 is superimposed with the busbar-directed flat plate 200.

More specifically, as described above, the busbar-directed flat plate 200 includes the busbar row 205 including the plurality of busbar assembly forming regions 210 arranged in series along the Y direction, and the coupling regions 230 coupling the busbar assembly forming regions 210 adjacent in the Y direction.

Therefore, as illustrated in FIGS. 11 and 12, the frame-body-directed flat plate 300 includes a frame body row 305 including the plurality of frame body forming regions 310 arranged in series in the Y direction at the same pitch as the plurality of busbar assembly forming regions 210, and coupling regions 330 coupling the frame body forming regions 310 adjacent in the Y direction.

As described above, the busbar-directed flat plate 200 includes the pair of gripping pieces 207 respectively coupled to one side and the other side of the busbar row 205 in the longitudinal direction (the Y direction), and the pair of gripping pieces 207 are provided with the alignment holes 208.

Accordingly, as illustrated in FIGS. 11 and 12, the frame-body-directed flat plate 300 also includes a pair of gripping pieces 307 respectively coupled to one side and the other side of the frame row 305 in the longitudinal direction (the Y direction), and the pair of gripping pieces 307 are provided with alignment holes 308 corresponding to the alignment holes 208.

The manufacturing method further includes a flat plate fixing step of fixing the busbar-directed flat plate 200 and the frame-body-directed flat plate 300 in a superimposed state, after the frame body forming process and after the busbar-side insulating layer forming step.

Figure 13:
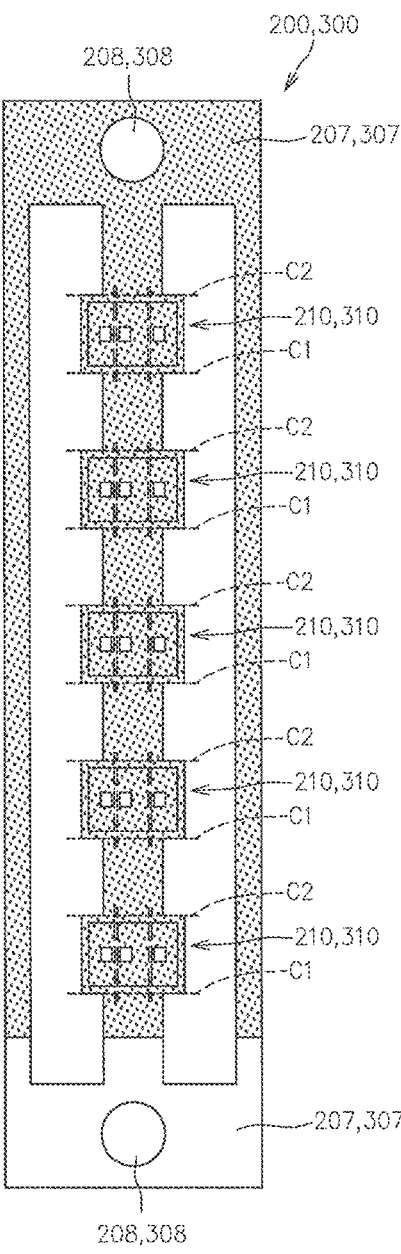
FIG. 13 is a plan view of the busbar-directed flat plate and the frame-body-directed flat plate after a flat plate fixing step of the manufacturing method.

FIG. 13 illustrates a plan view of the busbar-directed flat plate 200 and the frame-body-directed flat plate 300 after the flat plate fixing step.

The flat plate fixing step is configured so as to have the bottom surfaces of the frame body forming regions 310 after the frame body forming process fixed to the top surfaces of the busbar assembly forming regions 210 after the busbar-side insulating layer forming step.

The frame body forming regions 310 and the busbar assembly forming regions 210 can be fixed to each other with an adhesive.

Alternatively, instead of or in addition to the adhesive, it is also possible to utilize a curing effect of the insulating resin coating film forming the busbar-side insulating layer 20 or the insulating resin coating film forming the frame-body-side insulating layer 40.

That is, in a state where at least one of the insulating resin coating film forming the busbar-side insulating layer 20 and the insulating resin coating film forming the frame-body-side insulating layer 40 is in a semi-cured state, the two flat plates 200 and 300 can be fixed to each other by pressing the two flat plates 200 and 300 together in a superimposed state and then curing the semi-cured insulating resin coating film.

In the method of manufacturing the busbar assembly 1 including the frame body 30, the cutting step is configured so as to cut, after the flat plate fixing step, the busbar assembly forming regions 210 and the frame body forming regions 310 in the fixed state along the cutting lines C1 and C2 from the busbar-directed flat plate 200 and the frame-body-directed flat plate 300 (see FIG. 13).

In the present embodiment, the flat plate fixing step is performed after the laser light irradiation step.

That is, the laser light irradiation step is performed with respect to the busbar-directed flat plate 200 before the frame-body-directed flat plate 300 is fixed thereto to expose the second second-bottom-surface-region forming area 213b (and the top-surface-side connection portion forming region 212 in the present embodiment). Subsequently, the frame-body-directed flat plate 300 after the frame body forming process is fixed to the busbar-directed flat plate 200 in which the second-bottom-surface-region forming area 213b (and the top-surface-side connection portion forming region 212 in the present embodiment) is exposed.

Alternatively, the laser light irradiation step may be performed after the flat plate fixing step.

That is, the frame-body-directed flat plate 300 after the frame body forming process (the state illustrated in FIG. 12) may be fixed to the busbar-directed flat plate 200 after the busbar-side insulating layer forming step (the state illustrated in FIGS. 7A and 7B), and subsequently, the laser light irradiation step may be performed with respect to the busbar-directed flat plate 200 to which the frame-body-directed flat plate 300 is fixed.

In the present embodiment, the case of manufacturing the busbar assembly 1 has been described as an example, but the present invention is of course also applicable to a manufacturing process of other types of busbar assemblies.

Figures 14A, 14B, 14C:
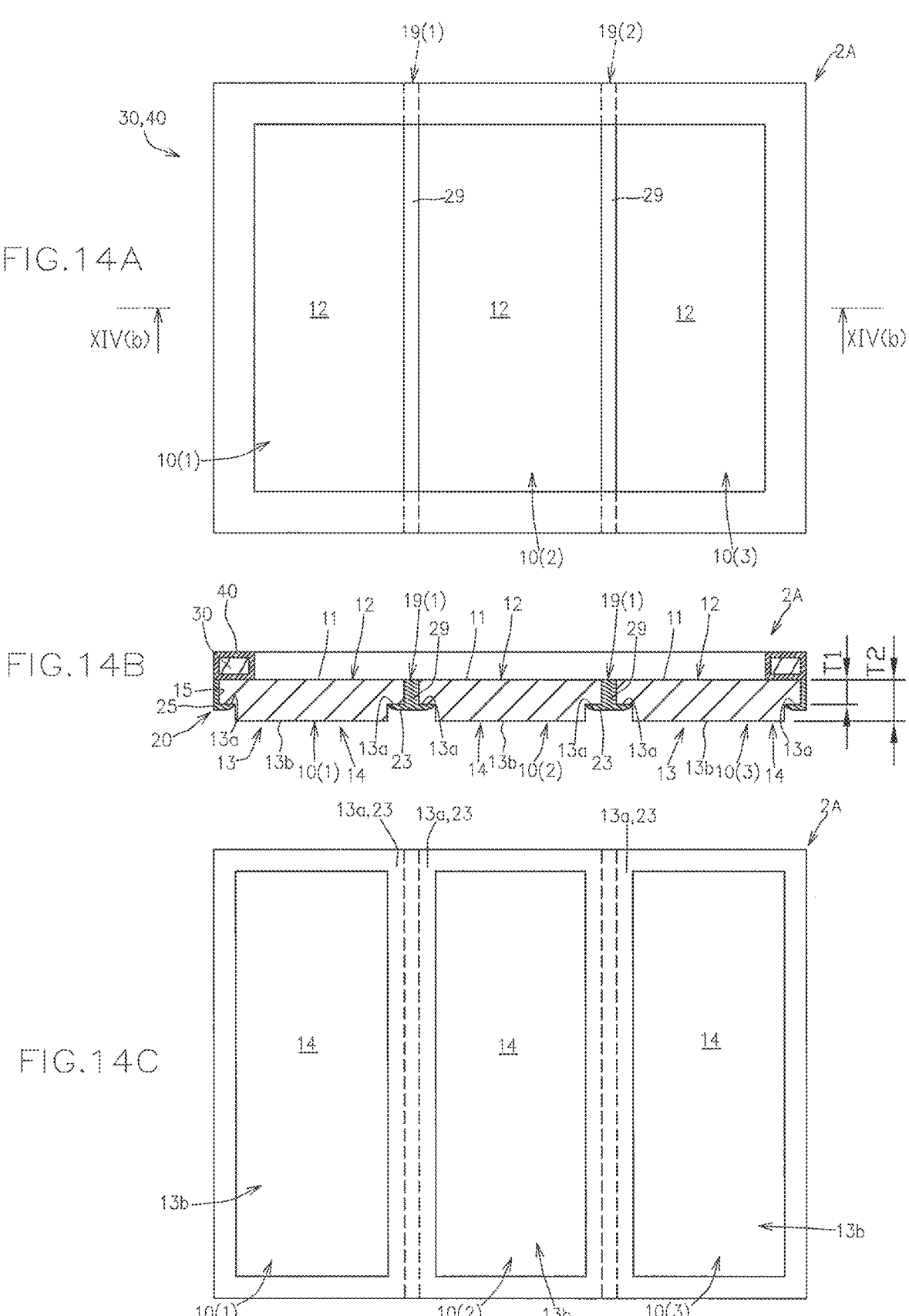
FIGS. 14A to 14C are a plan view of a busbar assembly according to a first modification, a cross-sectional view taken along the line XIV(b)-XIV(b) in FIG. 14A, and a bottom view of the busbar assembly according to the first modification, respectively.

FIGS. 14A to 14C illustrate a plan view of a busbar assembly 2A according to a first modification, a cross-sectional view taken along the line XIV(b)-XIV(b) in FIG. 14A, and a bottom view of the busbar assembly 2A, respectively.

In the drawings, the same members as those in the present embodiment are denoted by the same reference numerals.

The busbar assembly 2A according to the first modification is different from the busbar assembly 1 in that the top-surface-side laminated portion 21 is omitted.

A manufacturing method of the busbar assembly according to the first modification is different from the manufacturing method according to the present embodiment in the following aspects.

That is, the busbar-side insulating layer forming step is changed so that the insulating resin coating material is applied to the inside of the slits 219 and the entire area of the bottom surface 213 of the busbar assembly forming regions 210 (and optionally a lateral surface of the busbar assembly forming regions 210), and the applied insulating resin coating material is cured.

Further, in the laser light irradiation step, irradiating the top surface 211 of the busbar assembly forming region 210 with laser light is omitted.

In the busbar assembly 2A, the entire region of the top surfaces 11 of the plurality of busbars 10 (the first to third busbars 10(1) to 10(3)) surrounded by the frame body 30 acts as the top-surface-side connection portion 12.

Figures 15A, 15B, 15C:
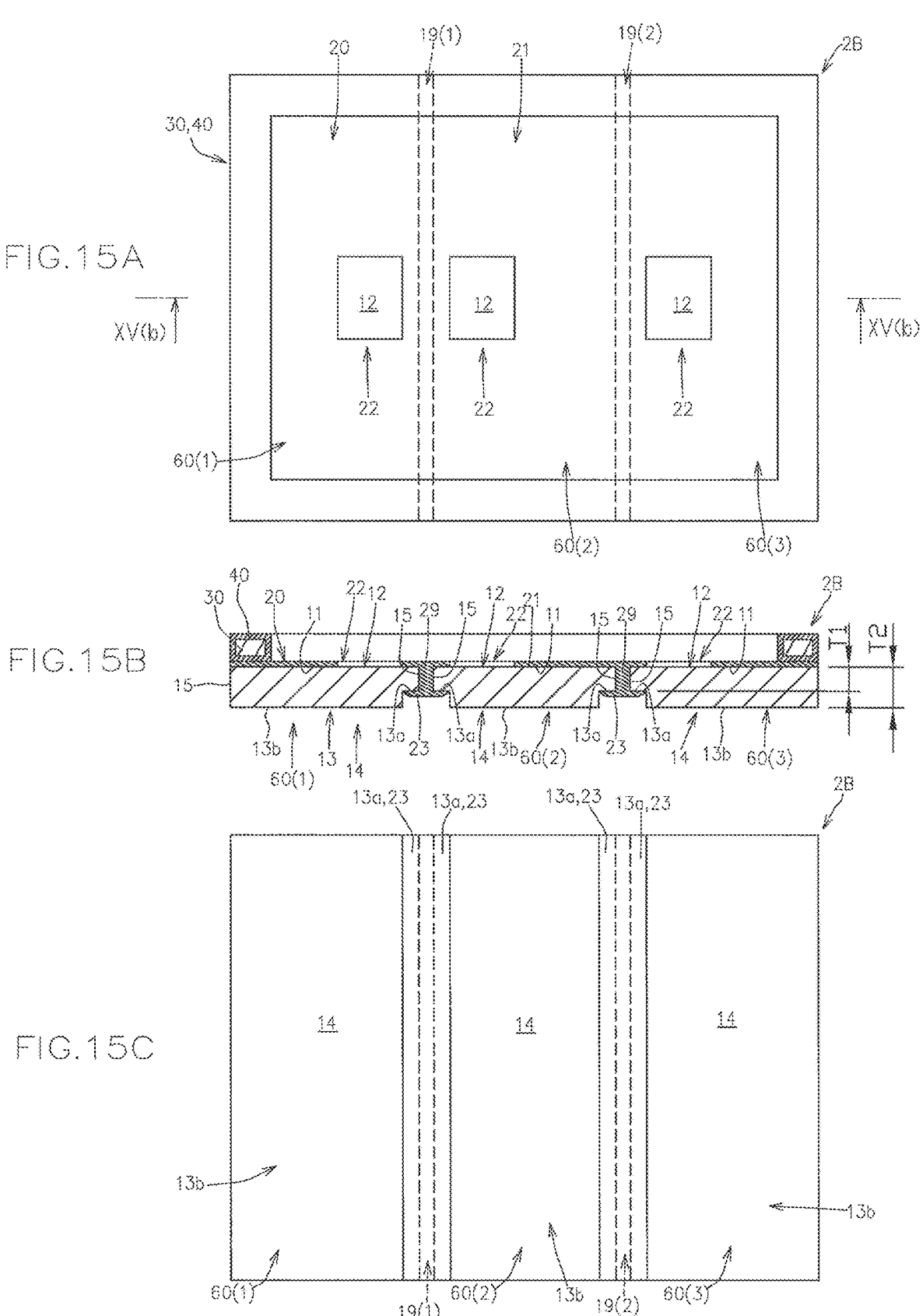
FIGS. 15A to 15C are a plan view of a busbar assembly according to a second modification, a cross-sectional view taken along line the XV(b)-XV(b) in FIG. 15A, and a bottom view of the busbar assembly according to the second modification, respectively.

FIGS. 15A to 15C illustrate a plan view of a busbar assembly 2B according to a second modification, a cross-sectional view taken along line the XV(b)-XV(b) in FIG. 15A, and a bottom view of the busbar assembly 2B, respectively.

In the drawings, the same members as those in the present embodiment and the first modification are denoted by the same reference numerals.

The busbar assembly 2B according to the second modification is different from the busbar assembly 1 in that the plurality of busbars 10 (the first to third busbars 10(1) to 10(3)) are changed to a plurality of busbars 60 (first to third busbars 60(1) to 60(3)).

That is, in the busbar 10, the first bottom surface region 13a extends along the entire peripheral edge of the bottom surface of the busbar 10 (see FIG. 1C and the like).

On the other hand, in the busbar 60, as illustrated in FIGS. 15B and 15C, the first bottom surface regions 13a located at the same positions in the thickness direction as lower end portions of the gaps 19 on the other side in the thickness direction, are only present in a region along lateral surfaces facing the gaps 19 in the peripheral edge of the bottom surface 13 of the busbar 60.

Further, in the busbar assembly 2B according to the second modification, the lateral-surface-side laminated portion 25 is omitted.

Figures 16A, 16B, 16C:
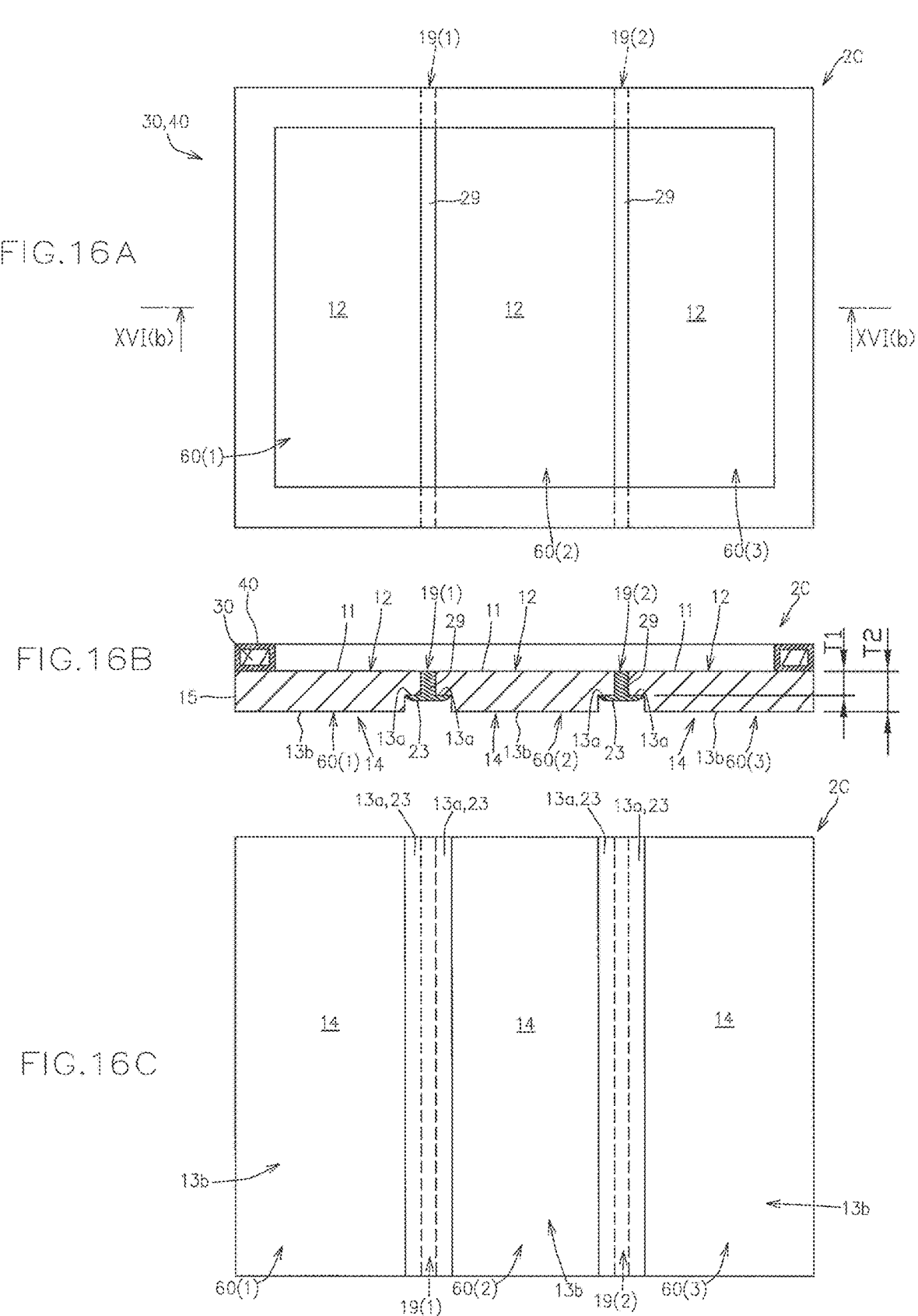
FIGS. 16A to 16C illustrate a plan view of a busbar assembly according to a third modification, a cross-sectional view taken along the line XVI(b)-XVI(b) in FIG. 16A and a bottom view of the busbar assembly according to the third modification, respectively.
Figure 17A:
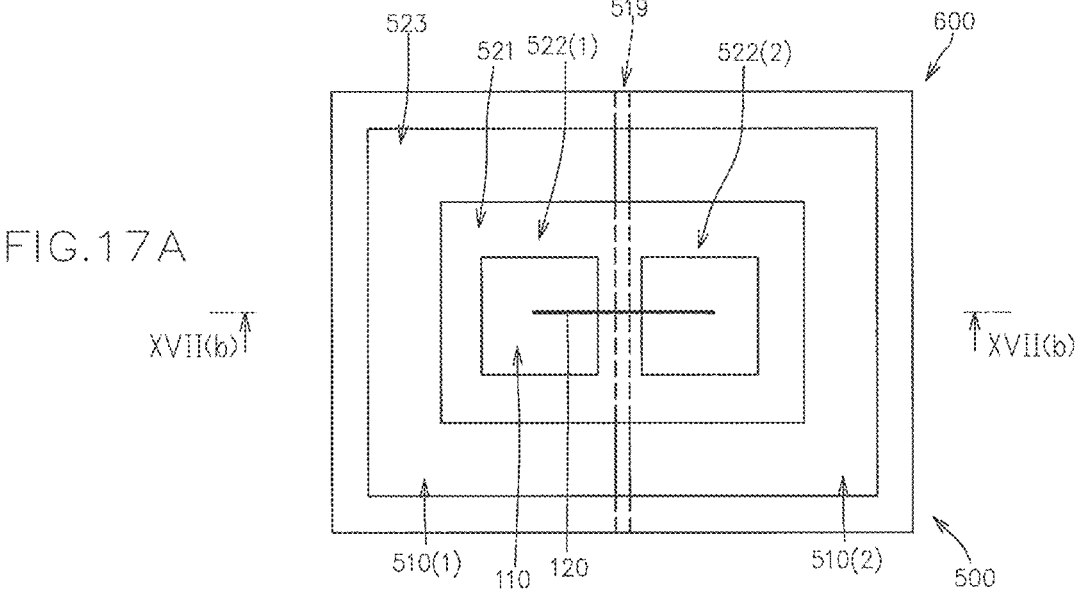
FIGS. 17A and 17 B are a vertical cross-sectional view of a semiconductor module including a conventional busbar assembly, and a cross-sectional view taken along the line XVII(b)-XVII(b) in FIG. 17A, respectively.
Figure 17B:
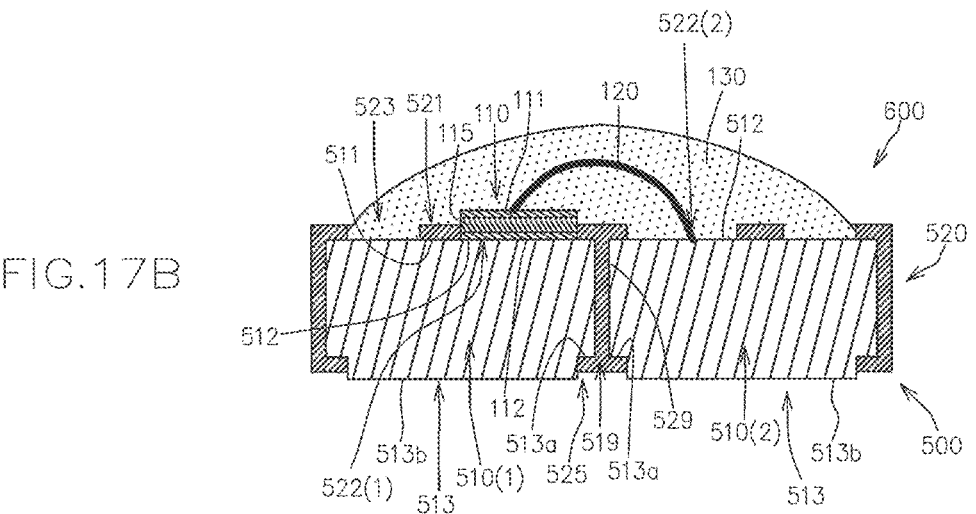

FIGS. 16A to 16C illustrate a plan view of a busbar assembly 2C according to a third modification, a cross-sectional view taken along the line XVI(b)-XVI(b) in FIG. 16A and a bottom view of the busbar assembly 2C, respectively.

In the drawings, the same members as those in the present embodiment, the first modification, and the second modification are denoted by the same reference numerals.

The busbar assembly 2C according to the third modification is different from the busbar assembly 1 in that the plurality of busbars 10 (the first to third busbars 10(1) to 10(3)) are changed to the plurality of busbars 60 (the first to third busbars 60(1) to 60(3)) and the top-surface-side laminated portion 21 is omitted.

That is, the busbar assembly 2C according to the third modification is different from the busbar assembly 2B according to the second modification in that the top-surface-side laminated portion 21 is omitted.

DESCRIPTION OF THE REFERENCE NUMERALS

10(1)-10(3) first to third busbars
11 top surface
12 top-surface-side connection portion
13 bottom surface
13a first bottom surface region
13b second bottom surface region
14 bottom-surface-side connecting portion
15 lateral surface
19(1), 19(2) first and second gaps
20 busbar-side insulating layer
21 top-surface-side laminated portion
22 opening in top-surface-side laminated portion
23 bottom-surface-side laminated portion
25 lateral-surface-side laminated portion
29 gap filling portion
30 frame body
40 frame-body-side insulating layer
60(1)-60(3) first to third busbars
200 busbar-directed flat plate
210 busbar assembly forming region
211 top surface of busbar assembly forming region
212 top-surface-side connection portion forming region
213 bottom surface of busbar assembly forming region
213a first-bottom-surface-region forming area
213b second-bottom-surface-region forming area
213c boundary between first- and second-bottom-surface-region forming areas
219(1), 219(2) first and second slits
290 laser light
300 frame-body-directed flat plate
310 frame body forming region

What is claimed is:

1. A method for manufacturing a busbar assembly including a plurality of busbars each formed by a conductive flat plate member and disposed in a common plane with a gap provided between lateral surfaces facing one another, and an insulative resin layer including a gap filling portion filled into the gap and a bottom-surface-side laminated portion extending integrally from the gap filling portion so as to be arranged on bottom surfaces of the plurality of busbars, wherein a top surface of each of the busbars is at least partially exposed to form a top-surface-side connection portion, and wherein the bottom surface of the busbar includes a first bottom surface region which is located at the same position in a thickness direction as a lower end portion of the gap and on which the bottom-surface-side laminated portion is arranged, and a second bottom surface region which is located farther away from the top surface than the first bottom surface region and is exposed to the outside to form a bottom-surface-side connection portion, the manufacturing method comprising:

a step of preparing a conductive metal busbar-directed flat plate having a busbar assembly forming area that has a planar shape corresponding to a busbar-connected body in which the plurality of busbars are connected to one another by a busbar-side insulating layer and that has the same thickness as a thickness between the top surface and the second bottom surface region;

a thickness adjustment step of adjusting the thickness of the busbar assembly forming region such that a thickness of a first-bottom-surface-region forming area, out of a bottom surface of the busbar assembly forming region, that corresponds to the first bottom surface region is made to coincide with a thickness between the top surface and the first bottom surface region of the busbar;

a slit forming step that is performed after or before the thickness adjustment step and that is configured so as to form one or a plurality of slits that penetrate the busbar assembly forming region in the thickness direction and have the same width as the gap so that the busbar assembly forming region is divided into a plurality of busbar forming parts corresponding to the plurality of busbars;

a busbar-side insulating layer forming step of applying an insulating resin coating material at least into the inside of the slits and to the entire area of the bottom surface of the busbar assembly forming region and then curing the applied insulating resin coating material to form the busbar-side insulating layer;

a laser light irradiation step of irradiating the laser light to, within a range that does not include the slit, at least an entire area of a second-bottom-surface-region forming area corresponding to the second bottom region and a boundary between the first-bottom-surface-region forming area and the second-bottom-surface-region forming area to expose the entire area of the second-bottom-surface-region forming area; and a cutting step of cutting the busbar assembly forming region from the busbar-directed flat plate.

2. The method for manufacturing the busbar assembly according to claim 1, wherein the busbar-side insulating layer forming step is configured so as to form the insulating layer onto the entire area of the top surface of the busbar assembly forming region, in addition to into the inside of the slit and onto the entire area of the bottom surface of the busbar assembly forming region, and wherein the laser light irradiation step is configured to irradiate laser light to a top-surface-side connection portion forming region, out of the top surface of the busbar assembly forming region, that corresponds to the top-surface-side connection portion so that the top-surface-side connection portion forming region is exposed.

3. The method for manufacturing the busbar assembly according to claim 1, wherein the busbar-directed flat plate integrally includes a plurality of the busbar assembly forming regions arranged in series in a first direction along the slit and a coupling region coupling the adjacent busbar assembly forming regions, and wherein the slit formed in one of the busbar assembly forming regions has one side, in the longitudinal direction, that extends into one of the coupling regions coupled to one side of the one busbar assembly forming region in the longitudinal direction, and another the other side, in the longitudinal direction, that extends into another one of coupling regions coupled to the other side of the one busbar assembly forming region in the longitudinal direction.

4. The method for manufacturing the busbar assembly according to claim 1, further comprising:

a frame body forming process that is executed before, after, or in parallel with the steps from the step of preparing the busbar-directed flat plate until the laser light irradiation step; and a flat plate fixing step that is executed after the frame body forming process and after the busbar-side insulating layer forming step, wherein the frame body forming process includes:

a step of preparing a conductive metal frame-body-directed flat plate including a frame body forming region having an outer shape corresponding to the busbar assembly forming region in a plan view, a punching step of punching out a center of the frame body forming region so that, when the frame body forming region is superimposed on the busbar assembly forming region, at least the top-surface-side connection portion forming region is exposed upward while being surrounded by the frame body in a plan view, and a frame-body-side insulating layer forming step of applying an insulating resin coating material to at least the bottom surface of the frame body forming region whose center is punched out and then curing the applied insulating resin coating material to obtain a frame-body-side insulating layer, wherein the flat plate fixing step is configured so as to have the bottom surface of the frame body forming region after the frame body forming process fixed to the top surface of the busbar assembly forming regions after the busbar-side insulating layer forming step, and wherein the cutting step is configured so as to cut, after the flat plate fixing step, the busbar assembly forming region and the frame body forming region that are fixed to each other from the busbar-directed flat plate and the frame-body-directed flat plate.

5. The method for manufacturing the busbar assembly according to claim 4, wherein the busbar-directed flat plate integrally includes a plurality of the busbar assembly forming regions arranged in series in a first direction along the slit and a coupling region coupling the adjacent busbar assembly forming regions, and wherein the slit formed in one of the busbar assembly forming regions has one side, in the longitudinal direction, that extends into one of the coupling regions coupled to one side of the one busbar assembly forming region in the longitudinal direction, and another side, in the longitudinal direction, that extends into another one of coupling regions coupled to the other side of the one busbar assembly forming region in the longitudinal direction, and wherein the frame-body-directed flat plate integrally includes a plurality of the frame body forming regions arranged in series in the first direction at the same pitch as the plurality of busbar assembly forming regions, and a coupling region coupling the adjacent frame body forming regions in the first direction.

6. The method for manufacturing the busbar assembly according to claim 4, wherein the flat plate fixing step is performed after the laser light irradiation step.

7. The method for manufacturing the busbar assembly according to claim 4, wherein the laser light irradiation step is performed after the flat plate fixing step.

* * * * *